(12) United States Patent
Sakurai et al.

(10) Patent No.: US 10,659,055 B1
(45) Date of Patent: May 19, 2020

(54) TWO STAGE GRAY CODE COUNTER WITH A REDUNDANT BIT

(71) Applicant: OmniVision Technologies, Inc., Santa Clara, CA (US)

(72) Inventors: Satoshi Sakurai, Cupertino, CA (US); Hiroaki Ebihara, Santa Clara, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 4 days.

(21) Appl. No.: 16/190,862

(22) Filed: Nov. 14, 2018

(51) Int. Cl.
*H03K 23/00* (2006.01)
*H03M 1/12* (2006.01)
*H04N 5/357* (2011.01)
*H04N 5/378* (2011.01)
*H03M 1/56* (2006.01)

(52) U.S. Cl.
CPC ........ *H03K 23/005* (2013.01); *H03M 1/1245* (2013.01); *H03M 1/56* (2013.01); *H04N 5/3575* (2013.01); *H04N 5/378* (2013.01)

(58) Field of Classification Search
CPC .... H03K 23/005; H03M 1/1245; H03M 1/56; H04N 5/3575; H04N 5/378
See application file for complete search history.

(56) References Cited

U.S. PATENT DOCUMENTS

| | | | |
|---|---|---|---|
| 7,629,913 B2 | 12/2009 | Okumura | |
| 7,671,317 B2 | 3/2010 | Shimomura et al. | |
| 8,102,449 B2 | 1/2012 | Kudo | |
| 8,406,370 B2 | 3/2013 | Hizu | |
| 8,736,732 B2 * | 5/2014 | Utsunomiya | H04N 5/374 348/308 |
| 9,053,999 B2 | 6/2015 | Iwaki et al. | |
| 9,363,452 B2 | 6/2016 | Iwaki et al. | |
| 9,374,539 B2 | 6/2016 | Kudo | |
| 9,473,722 B2 | 10/2016 | Iwaki | |
| 9,893,740 B1 * | 2/2018 | Ramakrishnan | H03M 1/144 |

(Continued)

OTHER PUBLICATIONS

S. Okura et al. "A 3.7 M-Pixel 1300-fps CMOS Igame Sensor With 5.0 G-Pixel/s High-Speed Readout Circuit", IEEE Journal of Colid-State Circuits, vol. 50, No. 4, Apr. 2015, 9 pages.

(Continued)

*Primary Examiner* — Amy R Hsu
(74) *Attorney, Agent, or Firm* — Christensen O'Connor Johnson Kindness PLLC

(57) ABSTRACT

An N bit counter includes a lower counter having a first output having M bits that operates a first counting frequency. An upper counter having a second output having N−M+L bits operates a second counting frequency. The second counting frequency is equal to the first counting frequency divided by $2^{(M-L)}$. An error correction controller is coupled to receive the first and second outputs and perform operations that include comparing the L least significant bits (LSBs) of the second output and at least one most significant bit (MSB) of the first output, and correcting the N−M MSBs of the second output in response to the comparison. The lower bits of the N bit counter are the M bits of the first output, and the upper bits of the N bit counter are the corrected N−M MSBs of the second output.

36 Claims, 18 Drawing Sheets

(56) References Cited

U.S. PATENT DOCUMENTS

| | | | |
|---|---|---|---|
| 2009/0026352 A1* | 1/2009 | Shimomura | H04N 5/3742 |
| | | | 250/214 R |
| 2010/0253821 A1* | 10/2010 | Yamamoto | H03K 4/02 |
| | | | 348/294 |
| 2012/0176518 A1 | 7/2012 | Yamazaki et al. | |
| 2012/0305752 A1* | 12/2012 | Shimizu | H04N 5/3577 |
| | | | 250/208.1 |
| 2013/0015329 A1 | 1/2013 | Iwaki | |
| 2014/0367551 A1* | 12/2014 | Hwang | H03K 21/026 |
| | | | 250/208.1 |
| 2017/0118427 A1 | 4/2017 | Totsuka et al. | |
| 2018/0139401 A1* | 5/2018 | Liabeuf | H04N 5/3765 |

OTHER PUBLICATIONS

European Patent Application No. 19207682.6—Extended European Search Report dated Feb. 7, 2020, 8 pages.

* cited by examiner

TWO STAGE GRAY CODE COUNTER WITH A REDUNDANT BIT

BACKGROUND INFORMATION

Field of the Disclosure

This disclosure relates generally to counter circuits, and in particular but not exclusively, relates to counter circuits for use with image sensors.

Background

Image sensors have become ubiquitous. They are widely used in digital still cameras, cellular phones, security cameras, as well as medical, automobile, and other applications. High dynamic range (HDR) image sensors have been required by many of those applications. Human eyes normally possess a dynamic range of up to about 100 dB. For automobile applications, an image sensor of more than 100 dB dynamic range to deal with different driving conditions, such as driving through a dark tunnel into bright sunlight, is often required.

When image sensors are used, photo-generated electrons in each of the plurality of pixel cells are transferred from a photodiode (PD) to a floating diffusion (FD) in the pixel cell for subsequent readout. A transfer (TX) transistor coupled between the PD and the FD is switched on and off under the control of a voltage pulse asserted to the TX gate terminal to enable this charge transfer. The image signal is amplified by a source follower (SF) transistor. When a row select (RS) transistor is enabled, the amplified image signal is transferred to an output line, called a bitline, of the pixel cell.

The analog image signal on the bitline is normally fed into an analog to digital converter (ADC) to be converted to digital image signal. A ramp type ADC is often used with image sensors to convert the analog image signal to the digital image signal. For a ramp type ADC, a counter starts to count when a ramp signal begins and is compared to an image signal. At the point when the ramp signal and the image signal are equal, the value of the counter is latched as digital representation of the analog image signal. To achieve higher resolution digital image signal outputs, the time resolution of the counter is increased. This requires that the clock frequency of the counter is increased. However, as the frequency of clock signals increase, the power consumption of the counter increases as well. Counter power consumption accounts for the majority of power consumption of many ADCs. Therefore, the reduction of counter power consumption becomes an important factor for reducing power consumption in many image sensors. Such power reduction becomes even more important when image sensor products are used in low power mobile applications.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
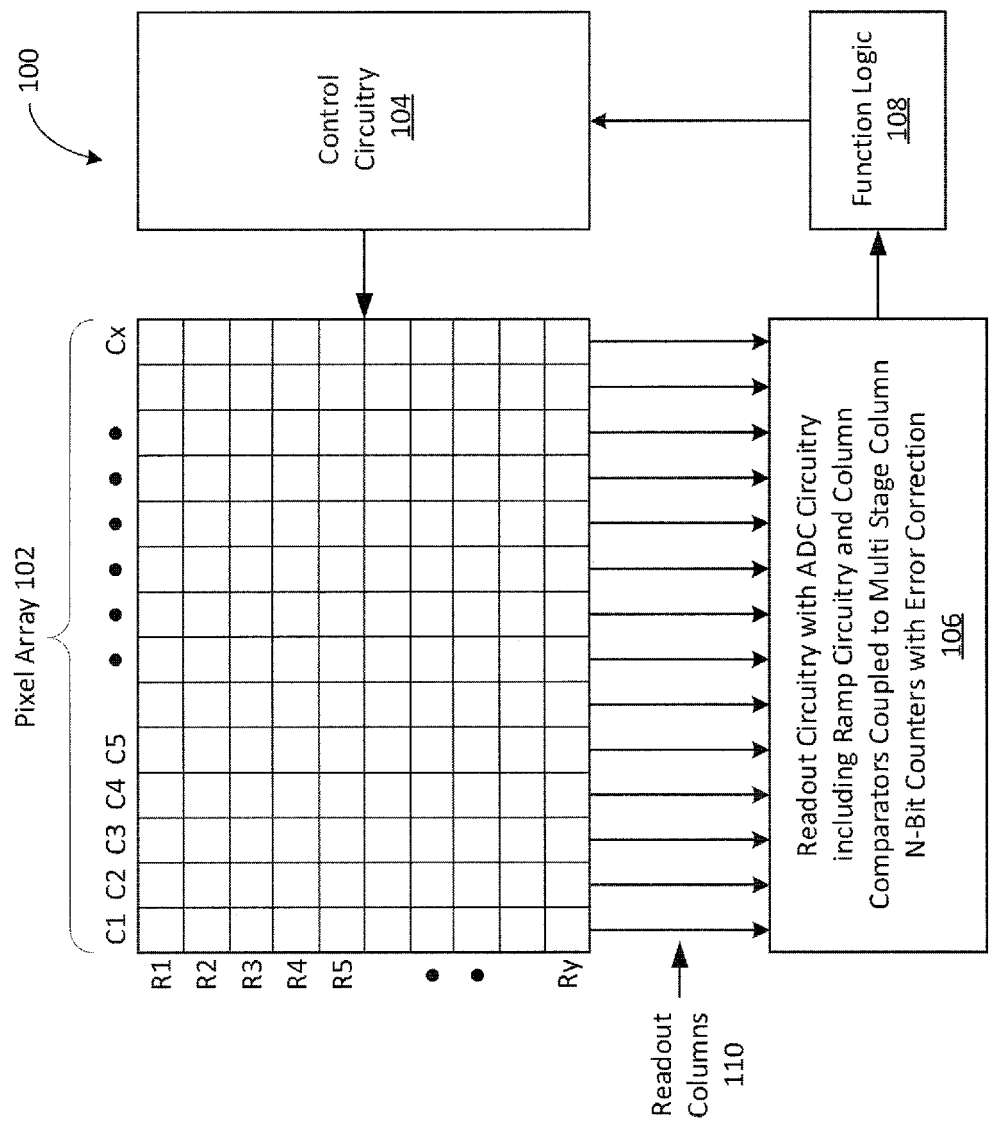
FIG. 1 is a block diagram that shows one example of an imaging system including a two stage counter with error correction in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Methods and apparatuses for generating an N bit count with error correction are disclosed. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be shown, examples of an N bit counter with error correction are disclosed. In the various examples, the N bit counter has multiple stages. In one example, a first stage is a lower counter and a second stage is an upper counter. The lower counter has a first output that has M bits, and the upper counter has N–M bits as well as an additional L redundant least significant bits that provide an error correction function for the N bit counter in accordance with the teachings of the present invention. L is a number greater than or equal to one. In various depicted examples, a shared Gray code counter may be used in one or more of the stages of the multi bit N bit counter. By using a Gray code counter, power consumption is reduced because of a minimum number of code transitions. On the other hand, as the counting frequency and the number of bits of a Gray code counter increase, the signal phase alignment of all the bits of Gray code becomes difficult, especially for a column parallel counter architecture for an image sensor application. An example in accordance with the teachings of the present invention provides a solution of phase alignment between the upper and lower bits of multi stage counter by utilizing a redundant bit and error correction. In so doing, the strict signal phase alignment requirement is limited only to the lower bit counter, which makes it significantly easier to design a fast counter circuit with a large number of bits in accordance with the teachings of the present invention. Examples of the disclosed N bit counter include an error correction controller that provides an error correction function. In one example, the error correction is provided by comparing the L least significant bits of the second output and at least one of the most significant bits of the first output. Depending on the result of the comparison, error correction operations may be performed on the N–M most significant bits of the upper counter as needed in accordance with the teachings of the present invention.

To illustrate, FIG. 1 illustrates one example of an imaging system 100 including readout circuitry that includes readout circuitry with an example a multi stage N bit counter with error correction in accordance with the teachings of the present invention. As shown, imaging system 100 includes pixel array 102, control circuitry 104, readout circuitry 106, and function logic 108. In one example, pixel array 102 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. In another example, however, it is appreciated that photodiodes do not necessarily have to be arranged into rows and columns, and may take other configurations in accordance with the teachings of the present invention.

In one example, after each image sensor photodiode/pixel in pixel array 102 has acquired its image charge through photo-generation of the image charge, the corresponding image data is readout by readout circuitry 106, and the digital representation of the image data is then transferred to function logic 108. Readout circuitry 106 may be coupled to readout image data from the plurality of photodiodes in pixel array 102. In various examples, readout circuitry 106 may include amplification circuitry and analog-to-digital (ADC) conversion circuitry including ramp circuitry and at least one column comparator coupled to at least one multi stage column N bit counter with error correction as will be discussed, or otherwise. In one example, readout circuitry 106 may readout a row of image data at a time along readout column lines 110 (illustrated) or may readout the image data using a variety of other techniques (not illustrated), such as a serial readout or a full parallel readout of all pixels simultaneously. Function logic 108 may store the image data or even manipulate the image data by applying post image effects (e.g., crop, rotate, remove red eye, adjust brightness, adjust contrast, or otherwise). In some examples, function logic 108 may require certain imaging conditions to be met and may therefore instruct the control circuitry 104 to manipulate certain parameters in pixel array 102 to achieve better qualities or special effects.

In imaging system 101, a ramp signal comparison type ADC is used in readout circuitry 106 to convert the pixel signal amplitude data read from pixel array 102 into digital image data. In the ramp type ADC included in readout circuitry 106, a counter starts to count when a ramp signal begins, which is compared to an image signal. At the point when the ramp signal and the image signal are equal, the value of the counter is latched as a digital representation of the analog image signal. In one example, the ADC counting is performed once for pixel reset signals, and once for combined signals. In an example with correlated double sampling (CDS), the difference of the two counter values between a pixel reset signal and a combined signal may be determined to return a true final ADC signal of any given pixel in accordance with the teachings of the present invention.

Figure 2:
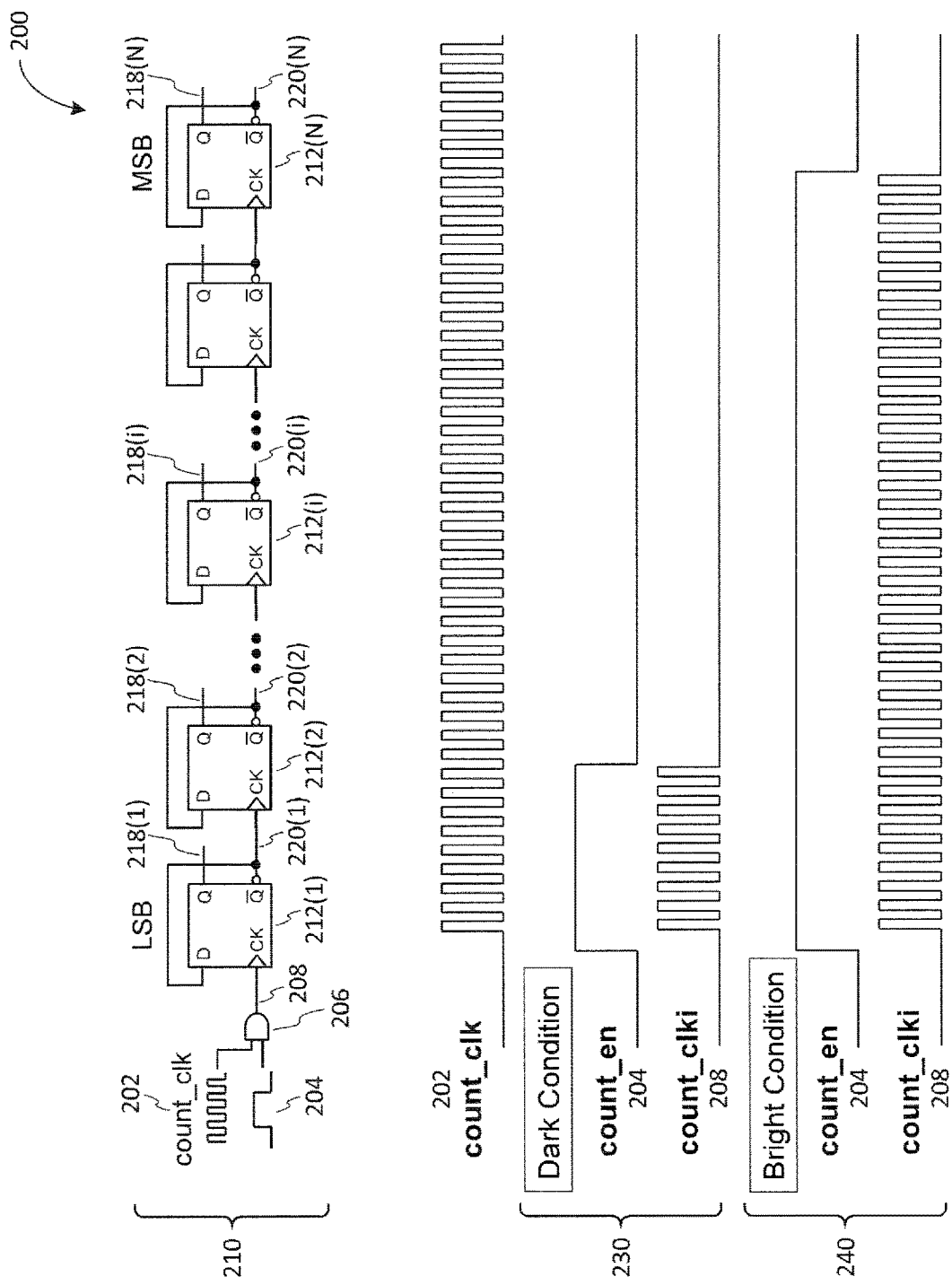
FIG. 2 is a block diagram illustrating one example of a ripple carry binary counter circuit and associated waveforms.

FIG. 2 is a block diagram 200 illustrating one example of a ripple carry binary counter circuit, which may also be referred to as a ripple counter 210, and associated waveforms that may be included in ADC circuitry of an imaging system. As shown in the illustrated example, ripple counter 210 includes a plurality of D flip-flops (DFFs) 212(1) to 212(N) that are coupled in series to form a DFF train. The clock input CK of the first DFF 212(1) in a DFF train is driven by an enabled counter clock signal count_clki 208. The count_clki 208 is a counter clock count clk 202 enabled by a counter enable signal 204 through an AND gate 206. Each of the inverted output Q_bar signal **220(*i*) of each DFF 212(*i*) is fed back to its own data D input as well as the clock input CK of the next DFF 212(*i*+1) in the DFF train, when there is a next DFF 220(*i*+1) in the DFF train. The resulting counting frequency of each clock signal introduced to a next clock input CK of a subsequent DFF 212(*i*+1) is divided by 2 at the output Q_bar 220(*i*) of each DFF 212(*i*)**.

As stated, the counting frequency introduced to the CK input of each subsequent DFF **212(*i*+1) is half of the counting frequency of the previous DFF 212(*i*). In the depicted example, the output Q 218(1) of the first DFF 212(1) to the leftmost of FIG. 2 represents the least significant bit (LSB) of the ripple counter 210, while the output Q 218(N) of the last DFF 212(N) to the rightmost of FIG. 2 represents the most significant bit (MSB) of the ripple counter 210. The number N of DFFs in a ripple counter is the same number of output bits of the ripple counter 210**.

The dark signal condition 230 shown in the example of FIG. 2 illustrates that there are less clock cycles of actual counter clock count_clki 208 needed to convert relative smaller amplitude under a dark signal condition 230 compared to a bright signal condition 240. As shown, under a bright signal condition 240, there are more clock cycles of actual counter clock count_clki 208 in order to convert relative larger amplitude image signal. Each clock cycle consumes power, and therefore more clock cycles leads to larger power consumption.

Figure 3:
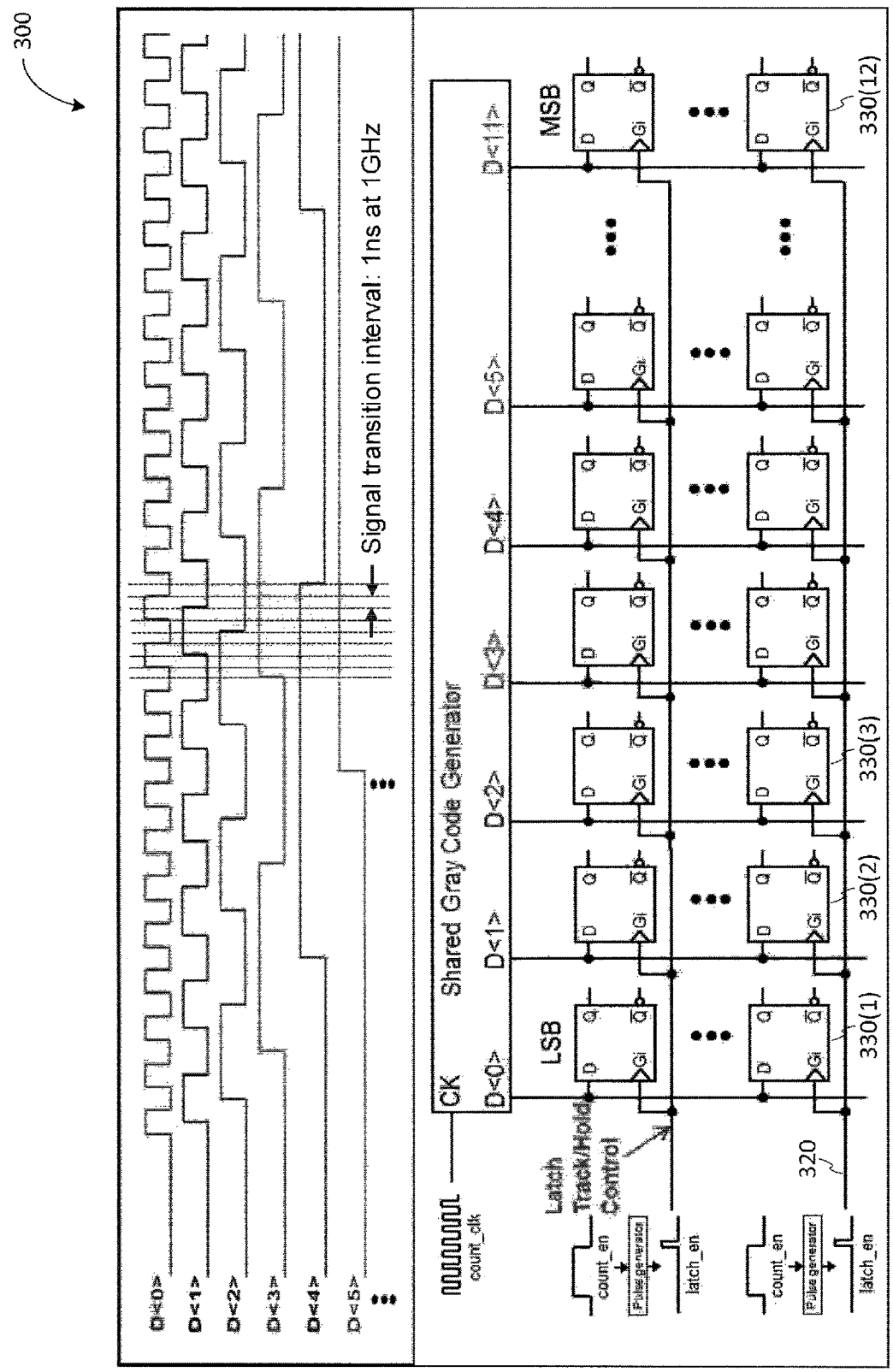
FIG. 3 is a block diagram illustrating an example counter structure including a single Gray code generator that is shared by a plurality of storage units for the LSB to the MSB.

FIG. 3 is a block diagram illustrating an example counter structure 300 including a single Gray code generator that is shared by a plurality of storage units for the LSB to the MSB. It is appreciated that the counter structure 300 may be included in ADC circuitry of an imaging sensor for all readout columns (e.g., readout columns 110). Sharing a Gray code generator is one solution to reduce power consumption in column counters for an imaging system. Gray code is a representation of binary code where any two successive values in a consecutive order differ in only one digital bit. Gray codes may be used to facilitate error correction in transmission of digital signals. When used in digital counters, Gray code limits the number of transactions among all binary bits between any two successive values in an ordering system to one. That is a least possible number to reach. The minimized number of bit transactions of Gray code counters results in less power consumption compared to binary counters.

However, each Gray code output bit, which are represented in FIG. 3 with bits D<0> to D<11>, have to keep precise signal transition intervals between all the bits. In practice, at a 1 GHz counting frequency when its interval reaches 1 ns, it becomes increasingly challenging to maintain the phase relationship among a large number of internal signals with increasing propagation delays resulting from circuit elements being placed further apart, and eventually, between D<0> and D<11>. Therefore, it becomes increasingly difficult for Gray code generator 310 to be able to align its output data D<0> and D<11> under required timing tolerances for latches 330(1) through 330(12) to reliably acquire their data enabled by the same latch enable signal latch_en 320.

Figure 4:
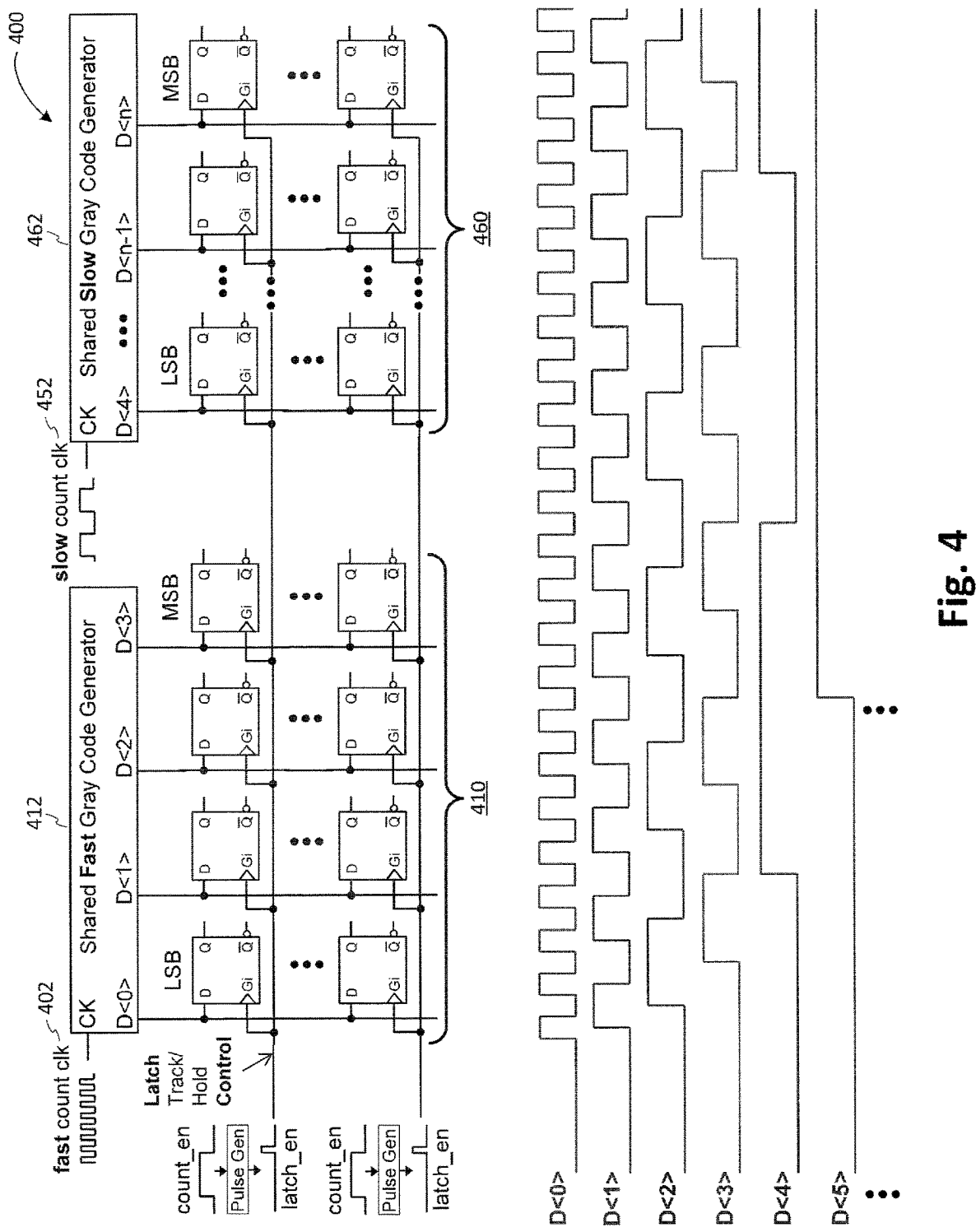
FIG. 4 is a block diagram illustrating an example multi stage counter structure including a Lower Bit Counter Gray code generator and an Upper Bit Counter Gray code generator.

One solution to overcome the phase alignment challenge among signals in a single Gray code generator is to utilize a multi stage counter in accordance with the teachings of the present invention. As shown in the example depicted in FIG. 4, a split 2-stage Gray counter includes a Lower Bit Counter (LBC) 410 that does not have too many bits, and therefore does not suffer from the phase alignment challenges discussed above. In the illustrated example, lower bit counter 410 includes 4 bits and runs at a first counting frequency under a first clock 402, and an Upper Bit Counter (UBC) 460 that may have more bits, but runs at a second counting frequency under a second clock 452. The Lower Bit Counter 410 has a fast Gray Code Generator 412 having output bits D<0>D<1>D<2>D<3>, which are shared by many column latches and runs at a high counting frequency. In one example, the LBC 410 may be a 4-bit counter operating at a 1 GHz counting frequency. The UBC 460 which may have as many bits as demanded, and operates at a much slower 62.5 MHz counting frequency, which is 1 GHz divided by 16 (=$2^4$).

Figure 5:
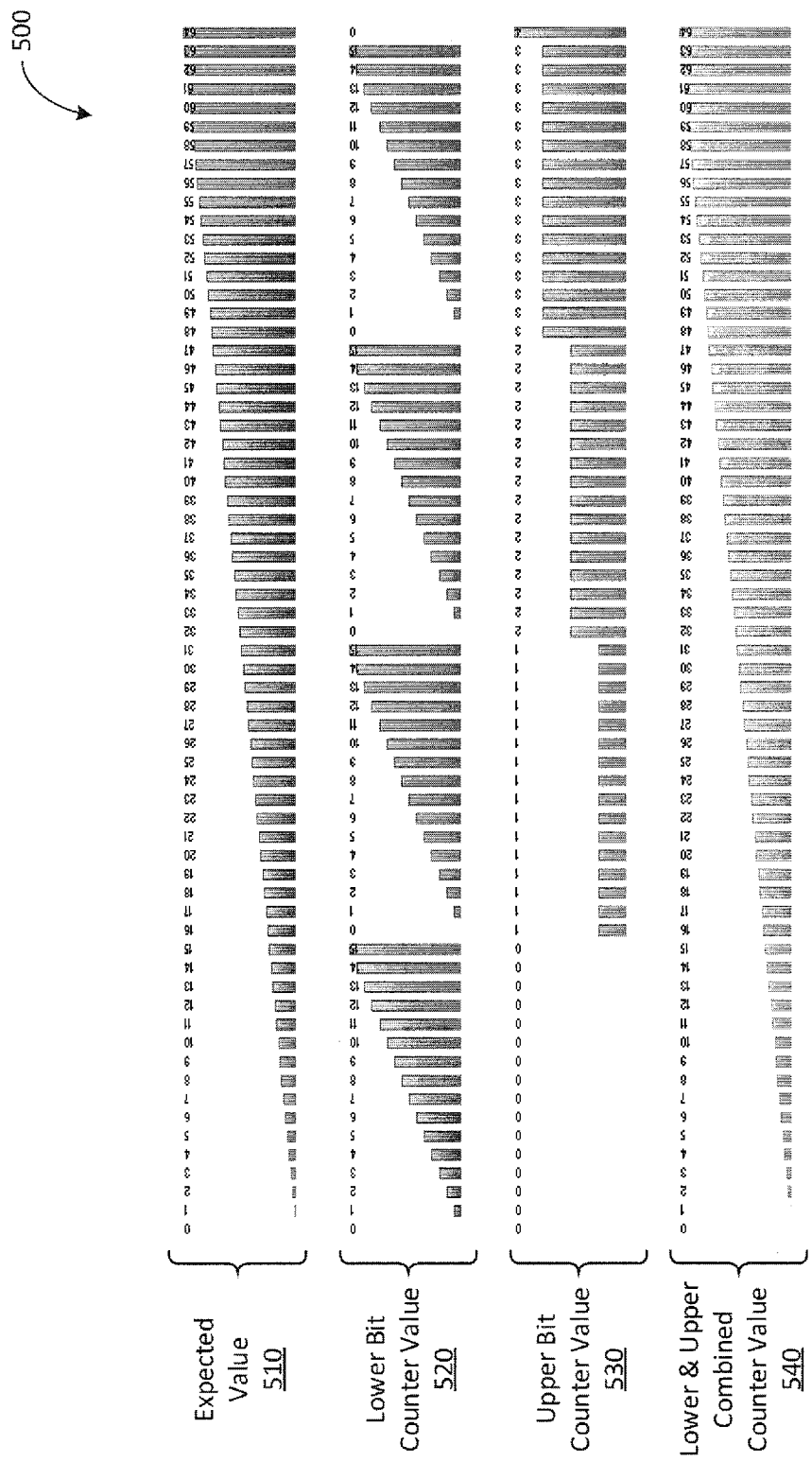
FIG. 5 is a diagram illustrating properly aligned output values of a Lower Bit Counter Gray code generator, an Upper Bit Counter Gray code generator, combined values, and expected values.

FIG. 5 is an example diagram 500 illustrating ideal properly aligned output values of a Lower Bit Counter Gray code generator, an Upper Bit Counter Gray code generator, combined values, and expected values. As shown, for a 2-stage Gray counter, the Lower Bit Counter counts up continuously in Gray code with an equivalent counter value 520 shown in FIG. 5. Its Upper Bit Counter also counts up continuously in Gray code with an equivalent counter value 530 shown in FIG. 5. As shown, when the phase of the all the output values are properly aligned, the combined counter value 540 of both Lower Bit Counter and Upper Bit Counter matches the expected value 510.

Figure 6:
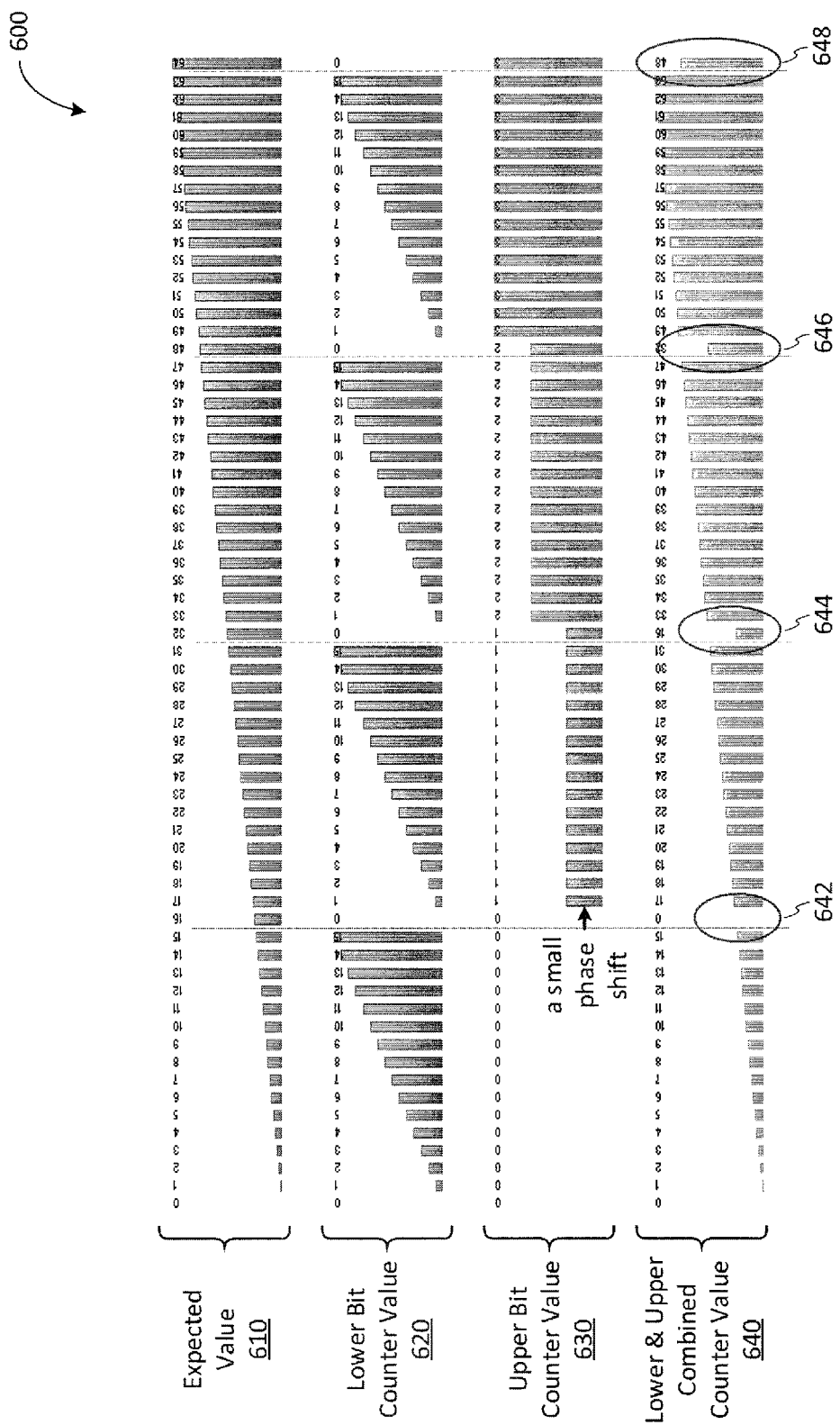
FIG. 6 is a diagram illustrating output values of a Lower Bit Counter Gray code generator, an Upper Bit Counter Gray code generator, combined values, and expected values that suffer from unwanted phase shift.

FIG. 6 is a diagram 600 illustrating output values of a Lower Bit Counter Gray code generator, an Upper Bit Counter Gray code generator, combined values, and expected values that may suffer from unwanted phase shift in practice. As shown, for a 2 stage Gray counter with phase alignment differences between the output bits of LBC 410 and UBC 460, problems starts to appear as demonstrated in FIG. 6. Although each LBC 410 and UBC 460 still counts normally individually as shown by 620 and 630, since the count of UBC experiences a delay (e.g., a small phase shift), when combined together, due to the misalignment in timing, the resulting counter value 640 does not match the expected value 610 anymore at 642, 644, 646 and 648. Such phase sensitivity is an inherent serious challenge associated with fast speed 2-stage counter that doesn't include any special treatment.

Figure 7:
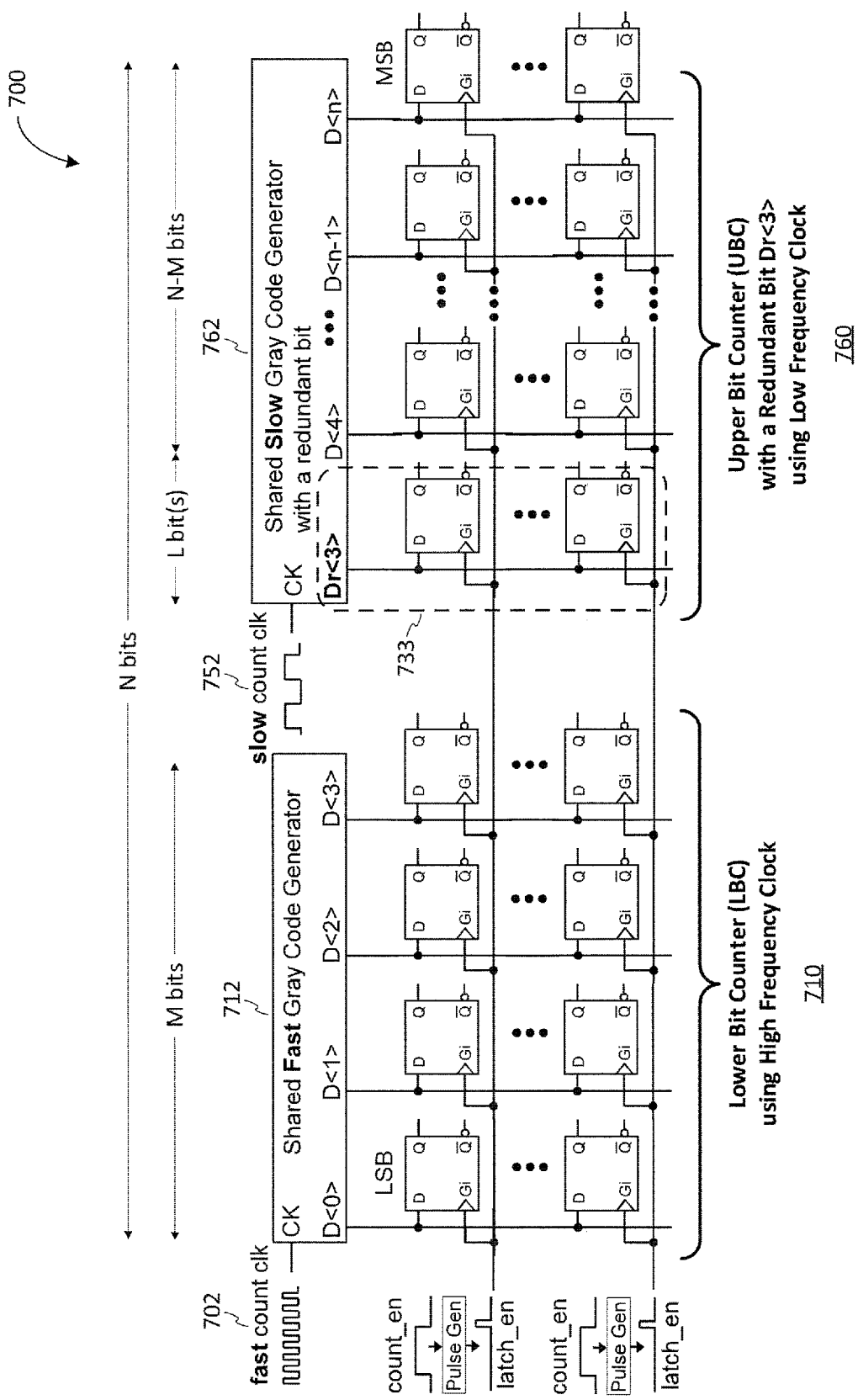
FIG. 7 is an illustration of one example of a multi stage N bit Gray counter with a redundant bit corrects the phase shift or phase alignment problems in accordance with the teachings of the present invention.

FIG. 7 is an illustration of one example of an N bit multi stage counter 700 with a redundant bit, which is used to correct the phase shift or phase alignment problems described above in accordance with the teachings of the present invention. In particular, the example multi stage counter illustrated in FIG. 7 illustrates a split two-stage N bit counter 700 that includes a LBC 710, which in the depicted example is a shared M bit Gray code counter that does not have too many bits to suffer internally from unwanted propagation delays or phase shifts. In the depicted example, M is less than N, and operates at a first counting frequency under a first clock 702. LBC 710 provides the M least significant bits (LSBs) of the N bit multi stage counter 700. For purposes of explanation, M=4 in the depicted example, and the M LSBs of LBC 710 are therefore labeled D<0>D<1>D<2>D<3>. It is appreciated that in other examples, M may be equal to values other than four in accordance with the teachings of the present invention. In the depicted example, UBC 760 is a shared N−M+L bit Gray code counter operates at a second counting frequency under a second clock 752, and can therefore have as many bits as needed. UBC 760 provides the N−M most significant bits (MSBs) of the N bit multi stage counter 700, which are labeled D<4> . . . D<n−1>D<n> in the example. In the illustrated example, UBC 760 also includes L additional bit(s). L is greater than or equal to one. In the example, the L additional bits are the least significant bit(s) of UBC 760 and can be thought of as "redundant" bits that are used to provide error correction in accordance with the teachings. In the example illustrated in FIG. 7, L=1 and the redundant bit is labeled Dr<3>.

As shown in the example, LBC 710 includes fast Gray code Generator 712 that is coupled to and is shared by the latch circuitry of multiple columns of an imaging system. In one example, the LBC 710 is a 4 bit Gray code counter operating at a first counting frequency under a first clock 702. In one example, first clock 702 has a counting frequency $f_{C1}$ equal to for example 1 GHz. UBC 760 has as many bits as needed (e.g., N−M bits), and also includes the additional L redundant bit(s) (e.g., Dr<3>), which are included as the least significant bit(s) of UBC 760. In the example, UBC 760 includes a slow Gray code Generator 762 that operates at a second counting frequency under a second clock 752, which in the example has a much lower counting frequency $f_{C2}$. As shown in the example, slow Gray code Generator 762 is also coupled to and shared by the latch circuitry of multiple columns of the imaging system. In one example, the slower counting frequency $f_{C2}$ of second clock 752 is equal to the counting frequency $f_{C1}$ of first clock 702 divided by $2^{(M-L)}$. Therefore, if we assume that $f_{C1}$=1 GHz, M=4, and L=1, then $f_{C2}$=1 GHz/$2^{(4-1)}$, which equals 1 GHz divided by 8, which is equal to 125 MHz in the depicted example. Thus, it is appreciated that examples in accordance with the teachings of the present invention allow the application of different clocks to the LBC and UBC because of the redundancy. With the slower counting frequency $f_{C2}$ of second clock 752, it is appreciated that power consumption of N bit multi stage counter 700 is reduced in accordance with the teachings of the present invention.

In operation, after a counting operation of LBC 710 and UBC 760 is complete, error correction operations are performed as needed on the output values in accordance with the teachings of the present invention. In the example, before error correction operations are performed, the Gray code is converted to binary code to detect the phase difference between the lower code and the upper code. As will be discussed, in one example error correction operations that are performed include comparing the L least significant bits (LSBs) of the UBC 760 and at least one most significant bit (MSB) of the LBC 710, and then correcting the N−M MSBs of the UBC 760 in response to the comparison of the L LSBs of the UBC 760 and the at least one MSB of the LBC 710. The lower bits of the N bit counter are the M bits of the LBC 710 and the upper bits of the N bit counter will be the corrected N−M MSBs of the UBC 760 in accordance with the teachings of the present invention.

Figure 8:
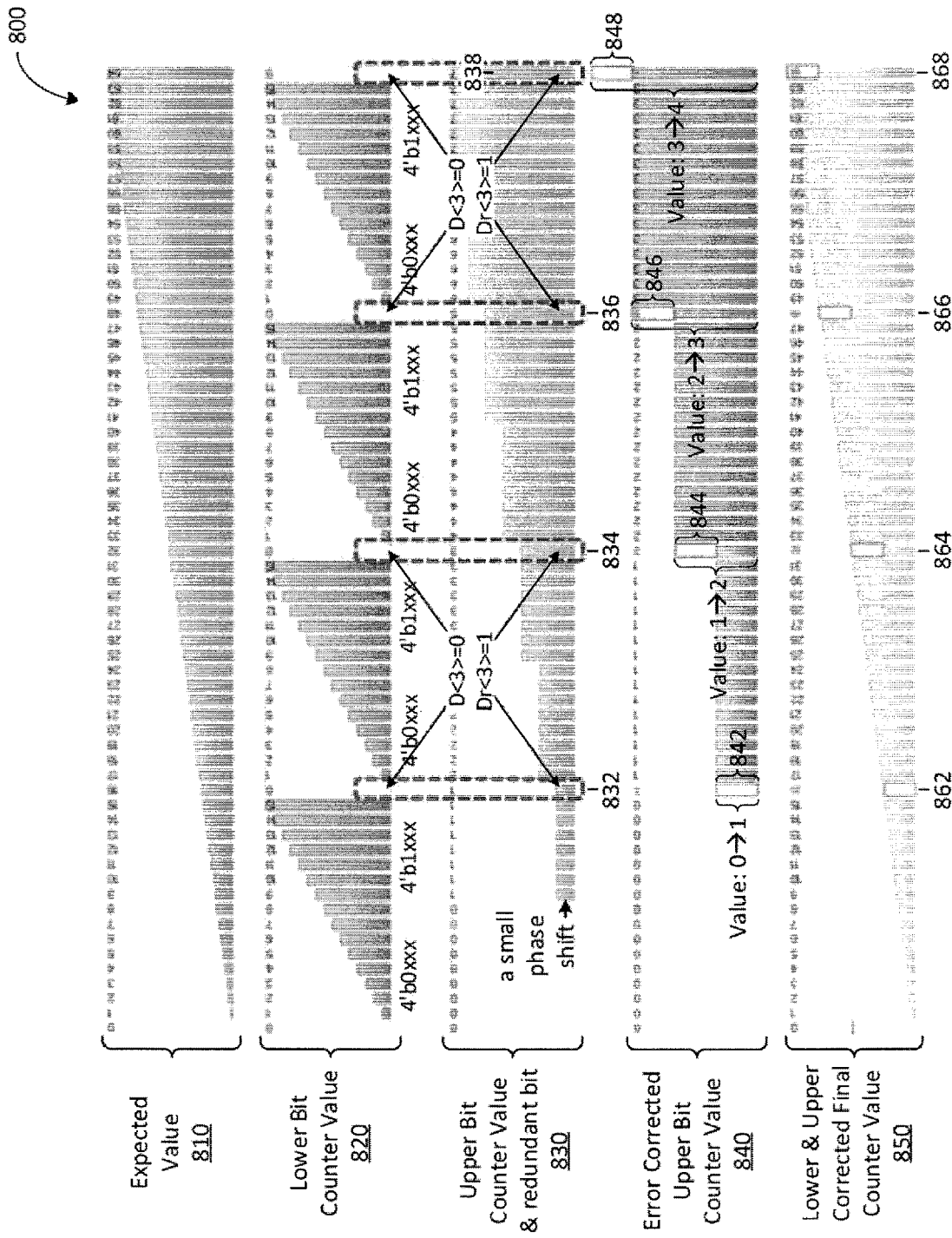
FIG. 8 is a diagram illustrating error correction with output values of a Lower Bit Counter Gray code generator, an Upper Bit Counter Gray code generator with a redundant bit, expected values, and corrected values to correct problems resulting from unwanted phase shift in accordance with the teachings of the present invention.

To illustrate, FIG. 8 is a diagram 800 illustrating output values of a Lower Bit Counter Gray code generator, an Upper Bit Counter Gray code generator with a redundant bit, expected values, and corrected values to correct errors resulting from unwanted phase shift in accordance with the teachings of the present invention. As stated above, after converting the Gray code to binary code, the L redundant bit(s) (e.g., Dr<3>) is/are introduced to UBC 760 as the LSB(s) of UBC 760 to correct errors caused by phase differences between LBC 710 and UBC 760. Continuing with the problems discussed above with respect to FIG. 6, it is demonstrated in the example illustrated in FIG. 8 that when the MSB D<3> of the LBC 710 and the LSB Dr<3> of the UBC 760 are compared, correct counter values can be deducted in accordance with the teachings of the present invention. For example, if the MSB D<3> of the LBC 710 is 0, and the LSB of the UBC 760 (e.g., redundant bit Dr<3> of FIG. 7) is 1 due to the phase shift illustrated in FIG. 6, the counter value represented by the N−M MSBs (e.g., D<4> through D<n> of FIG. 7) of the UBC 760 (excluding the redundant bit Dr<3>) is incremented by 1 according to the error correction operations in accordance with the teachings of the present invention.

As mentioned above, when the phases of the two Gray code signals in LBC 710 and UBC 760 are perfectly in phase and aligned, a combined 4-bit LBC 710 and multi-bit UBC 760 deliver correct combined code 540 to match the expected code 510 as illustrated in FIG. 5, where both LBC 710 count code 520 and UBC 760 count code 530 operate perfectly without any misalignment. However, when there is a phase mismatch between the two Gray code signals in LBC 710 and UBC 760, such as for example when UBC 760 has unwanted delay causing UBC 760 to miss an initial incremental count as shown in UBC code 630, the combined LBC count code 620 and UBC count code 630, as shown in combined code 640 not counting in time to match the expected code 610. Consequently, the combined 2-stage counter does not deliver correct results any more at this point if the redundant bit Dr<3> of FIG. 7 is not utilized.

With the redundant bit Dr<3> introduced as shown in FIG. 7, the N bit counter in accordance with the teachings of the present invention becomes highly immune to the phase mismatch. Regardless of the phase difference, the final combined counter value can be corrected by using D<3> and the redundant bit Dr<3>. When D<3>=0 and Dr<3>=1, the value represented by the N−M MSBs (e.g., D<4> through D<n>) of UBC 760 is incremented by 1. In this example, for other values of D<3> and Dr<3>, the N−M MSBs of UBC 760 are not incremented.

For instance, FIG. 8 shows at time points 832, 834, 836, and 838 missed values shown to the UBC value 830 have been added back by 842, 844, 846, and 848 to the error corrected UBC values 840, and by 862, 864, 866, and 868 to the final combined counter value 850 when conditions D<3>=0 and Dr<3>=1 are met within 832, 834, 836, and 868. As shown, the final combined counter value 850 equals the expected value 810. Therefore, counting errors in UBC 760 that are caused by phase shifts are corrected using the error correction operations in accordance the teachings of the present invention.

Figure 9:
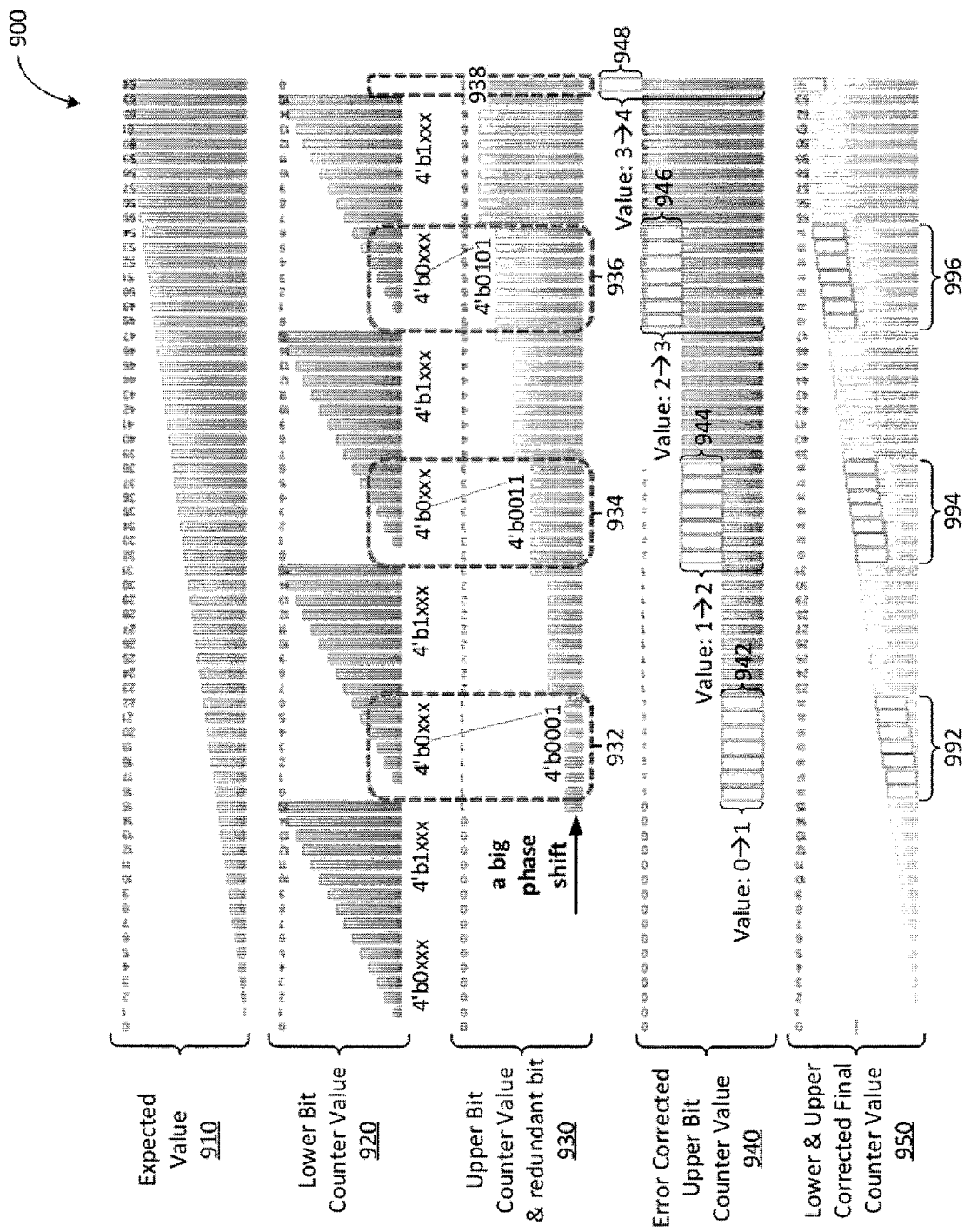
FIG. 9 is a another diagram illustrating error correction with output values of a Lower Bit Counter Gray code generator, an Upper Bit Counter Gray code generator with a redundant bit, expected values, and corrected values to correct problems resulting from a larger unwanted phase shift in accordance with the teachings of the present invention.

FIG. 9 is a another diagram 900 illustrating error correction operations with output values of a Lower Bit Counter Gray code generator, an Upper Bit Counter Gray code generator with a redundant bit, expected values, and corrected values to correct problems resulting from a larger unwanted phase shift in accordance with the teachings of the present invention. For the larger phase shift illustrated FIG. 9, in time regions 992, 994, and 996, additional 1's have been added back by 942, 944, and 946 to the error corrected UBC values 940 in these regions where the conditions D<3>=0 and Dr<3>=1 are met within regions 932, 934, and 936 as shown. The final combined counter value 950 equals the expected value 910. Value miscounts to the UBC 760 caused by a large phase shift are also completely corrected. Using the error correction operations in accordance with the teachings of the present invention, whenever unwanted phase shifts happen, large or small, within the shaded regions illustrated in FIG. 8 or 9, errors in UBC 760 can be corrected in accordance with the teachings of the present invention.

Figure 10:
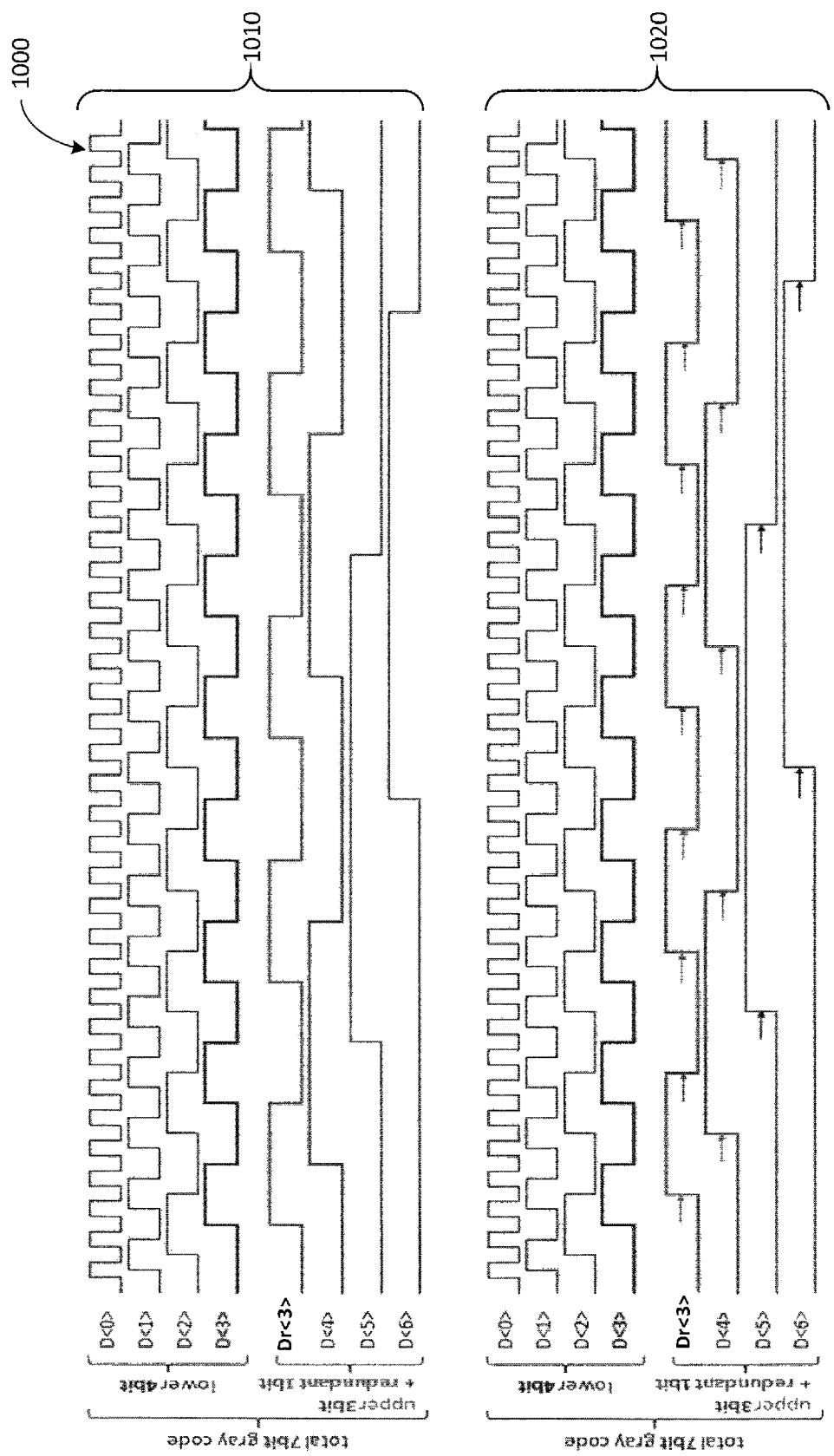
FIG. 10 is timing diagram illustrating waveforms of an example of error correction operations with a phase shift added intentionally to the upper counter in accordance with the teachings of the present invention.

FIG. 10 is timing diagram 1000 illustrating waveforms of an example of error correction operations in which a known phase shift is added to the upper counter in accordance with the teachings of the present invention. For instance, FIG. 10 illustrates a 4 bit LBC 710 and 3-bit UBC 760 with a redundant bit Dr<3> (e.g., N=7, M=4, and L=1). Ideal Gray code waveforms are shown in waveforms 1010 without any phase shift. However, as shown in the example waveforms 1020, error correction operations include intentionally phase shifting the counting start time of the counting operation of the upper counter (e.g., UBC 760) relative to the counting start time of the counting operation of the lower counter (e.g., LBC 710) in accordance with the teachings of the present invention.

Figure 11:
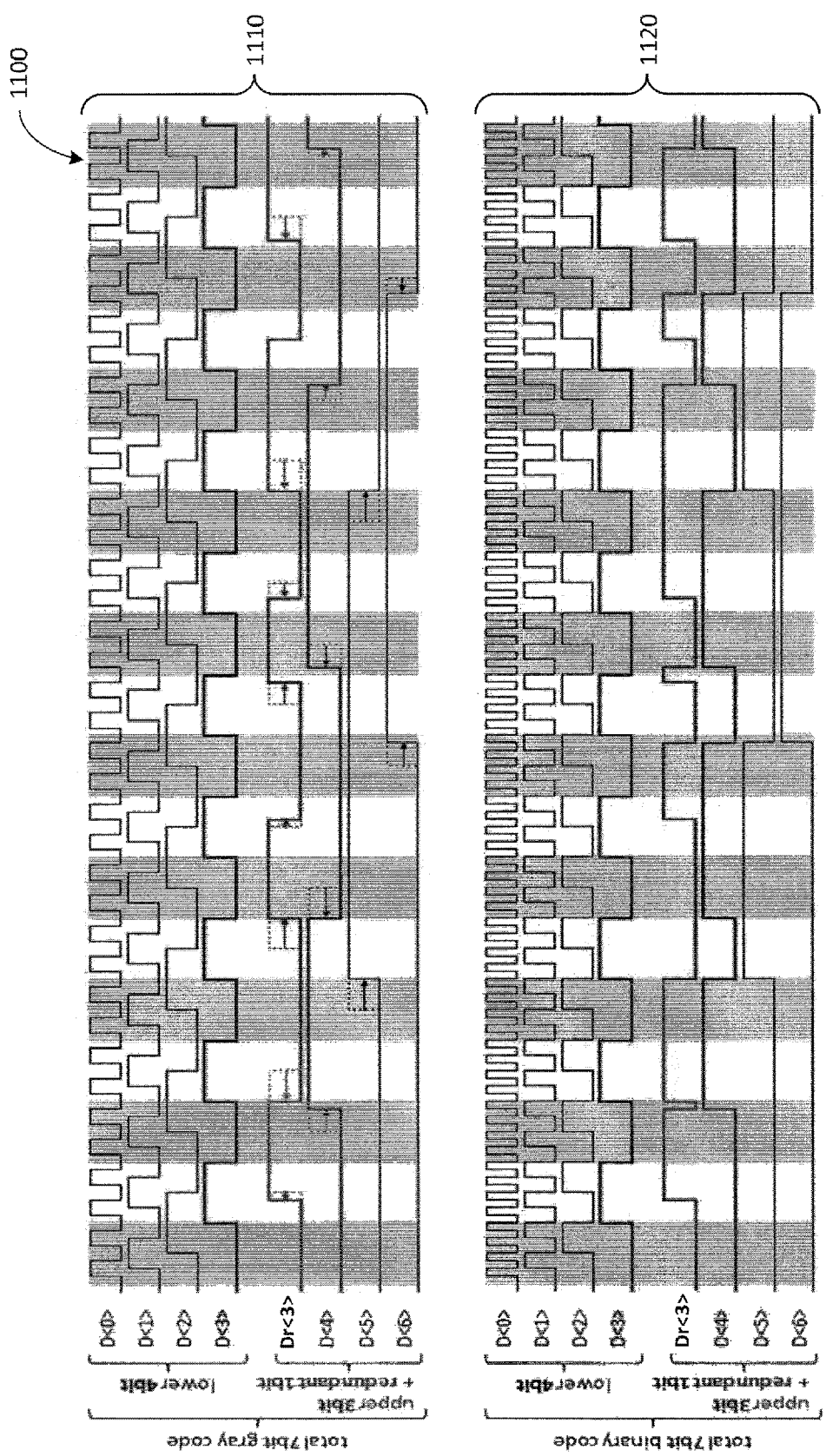
FIG. 11 is timing diagram showing Gray code waveforms and corresponding binary code waveforms with phase shift errors to be corrected using example error correction operations in accordance with the teachings of the present invention.

Continuing with the example shown in FIG. 10, FIG. 11 is timing diagram 1100 showing Gray code waveforms and corresponding binary code waveforms with additional unwanted phase shift errors to be corrected using example error correction operations in accordance with the teachings of the present invention. Starting with the intentionally phase shifted waveforms shown in 1020 of FIG. 10, timing diagram 1100 of FIG. 11 further assumes that each edge of the UBC bits is further shifted again in random directions by a random amount, but still within correctable ranges, which in the illustrated example is within the width of the shaded regions as shown by the Gray code in diagram 1110. When the Gray code represented in diagram 1110 is converted to binary code as shown in diagram 1120, the errors in the UBC binary data bits D<4> through D<6> are readily apparent.

Figure 12:
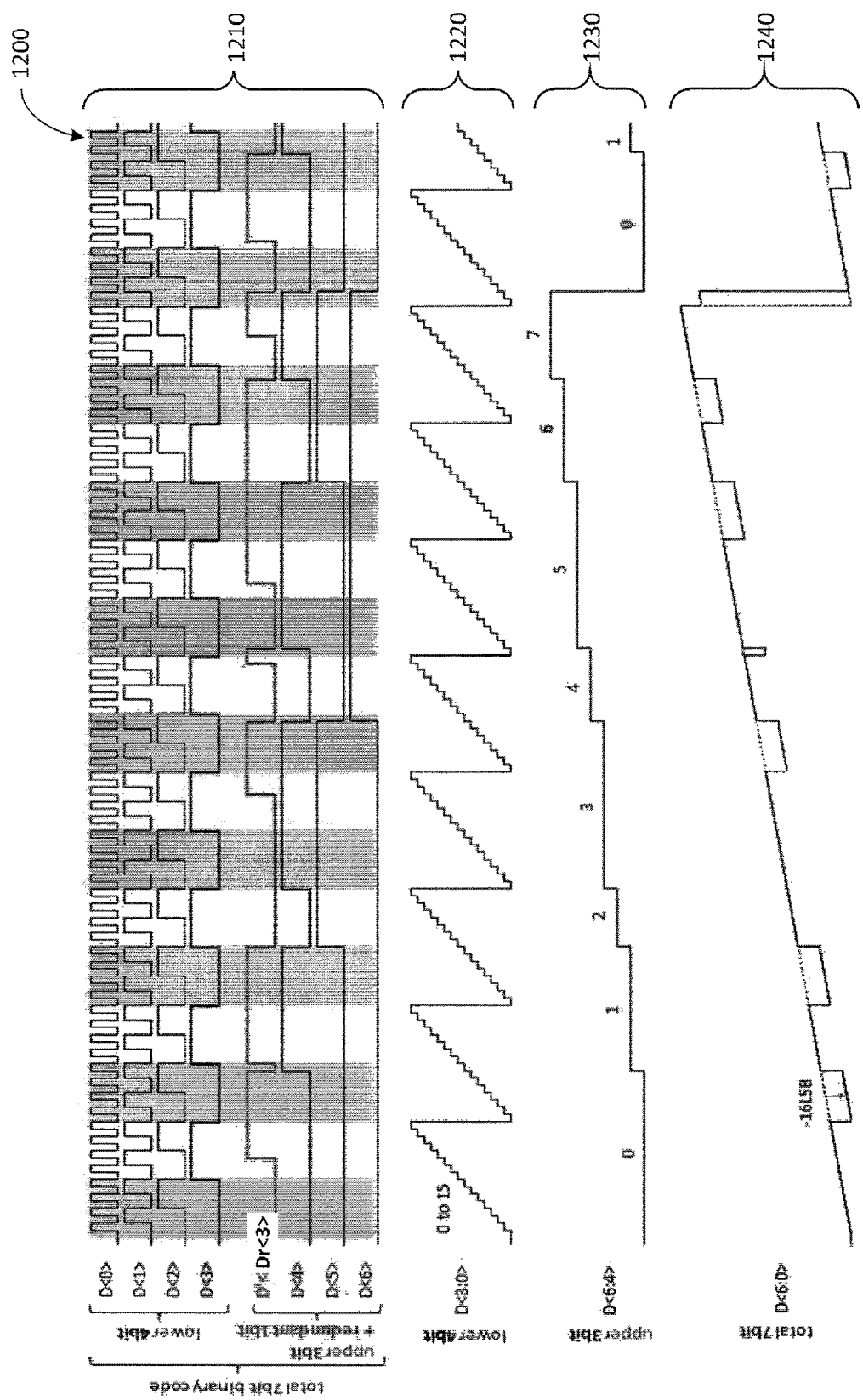
FIG. 12 is timing diagram showing binary code waveforms and corresponding lower bit counts, upper bit counts, and total counts with errors to be corrected using example error correction operations in accordance with the teachings of the present invention.

FIG. 12 is timing diagram showing binary code waveforms corresponding to the waveforms of FIG. 11, and the corresponding lower bit counts, upper bit counts, and total counts with errors to be corrected using example error correction operations in accordance with the teachings of the present invention. As shown in FIG. 12, the binary code 1120 of N bit counter 700 reappears in waveforms 1210. The 4 lower binary bits D<O> through D<3> count perfectly as shown in waveforms 1220. However, the 3 upper binary bits D<4> through D<6> are distorted as shown in waveforms 1230. Due to the binary weight of D<4> (i.e., $2^4$=16), each of errors in D<4> causes a $2^4$ or 16× error relative to the D<0> (the LSB) values. Indeed, the overall binary code shown with bits D<0> through D<6> are full of the errors as illustrated by the many notches (with depth of −16 LSB) where the correct result should be as smooth as indicated by the dashed lines in 1240.

Figure 13:
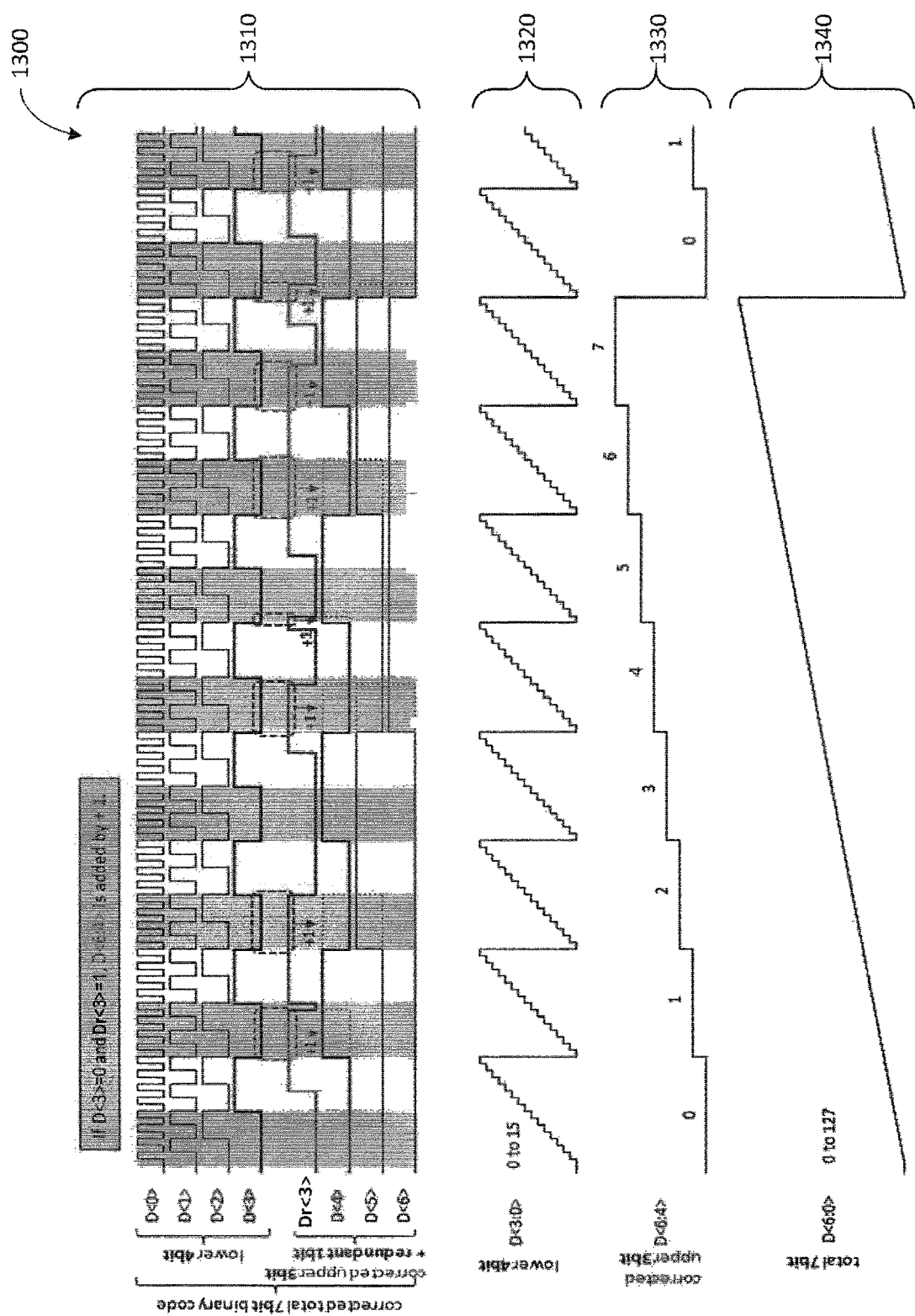
FIG. 13 is timing diagram showing binary code waveforms with errors and corresponding lower bit counts, upper bit counts, and total counts with errors that have been corrected using example error correction operations in accordance with the teachings of the present invention.

FIG. 13 is timing diagram showing binary code waveforms with errors and corresponding lower bit counts, upper bit counts, and total counts with errors that have been corrected using example error correction operations in accordance with the teachings of the present invention. In particular, FIG. 13 shows the corrected results after the errors shown in FIG. 12 have been corrected using the error correction operations of incrementing the value of D<6:4> by 1 when D<3>=0 and Dr<3>=1, as shown in waveforms 1310. The corrected D<6:4> values are shown in waveform 1330. The corrected final 7-bit D<6:0> is shown in waveform 1340.

Figure 14:
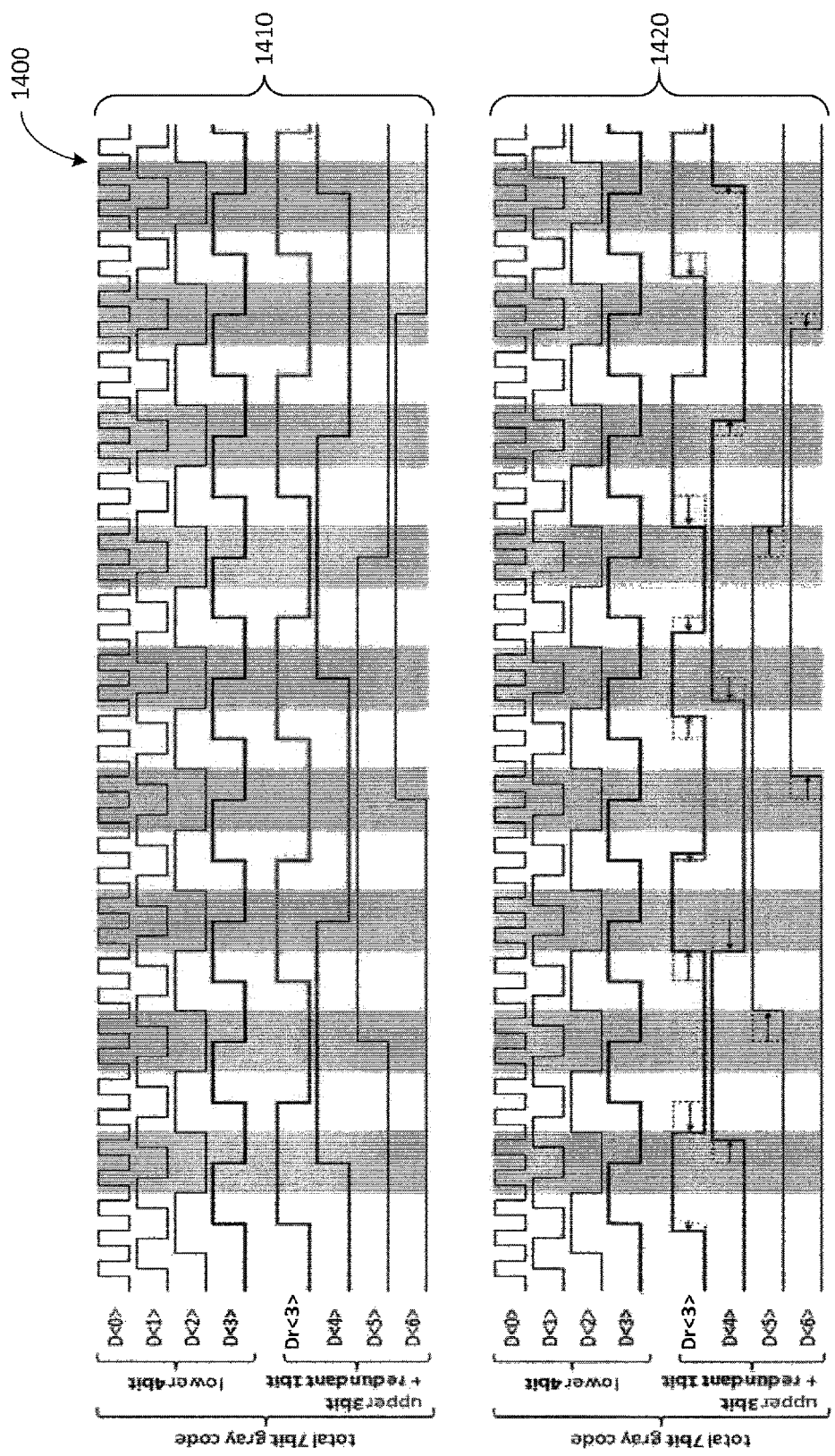
FIG. 14 is timing diagram illustrating waveforms of yet another example of error correction operations without phase shift added intentionally to the upper counter in accordance with the teachings of the present invention.

In the example error correction operations described above in FIGS. 10-13, the counting start time of the counting operation of the UBC bits D<6:4> and Dr<3> was intentionally delayed or phase shifted relative to the counting start time of the counting operation of the lower counter LBC bits D<3:0> as indicated in waveforms 1020 of FIG. 10. FIG. 14 is timing diagram 1400 illustrating waveforms of yet another example of error correction operations without intentional delay or phase shift added in accordance with the teachings of the present invention. Without any intentional phase shift, ideal Gray code waveforms are shown in waveforms 1410 in FIG. 14. However, in waveforms 1420, UBC 760 suffers from unwanted phase shift as illustrated by each edge of the UBC 760 bits D<6:4> and Dr<3> being shifted in a random direction by a random amount, but still within correctable ranges as illustrated by being within the width of the shaded regions in waveforms 1420.

Figure 15:
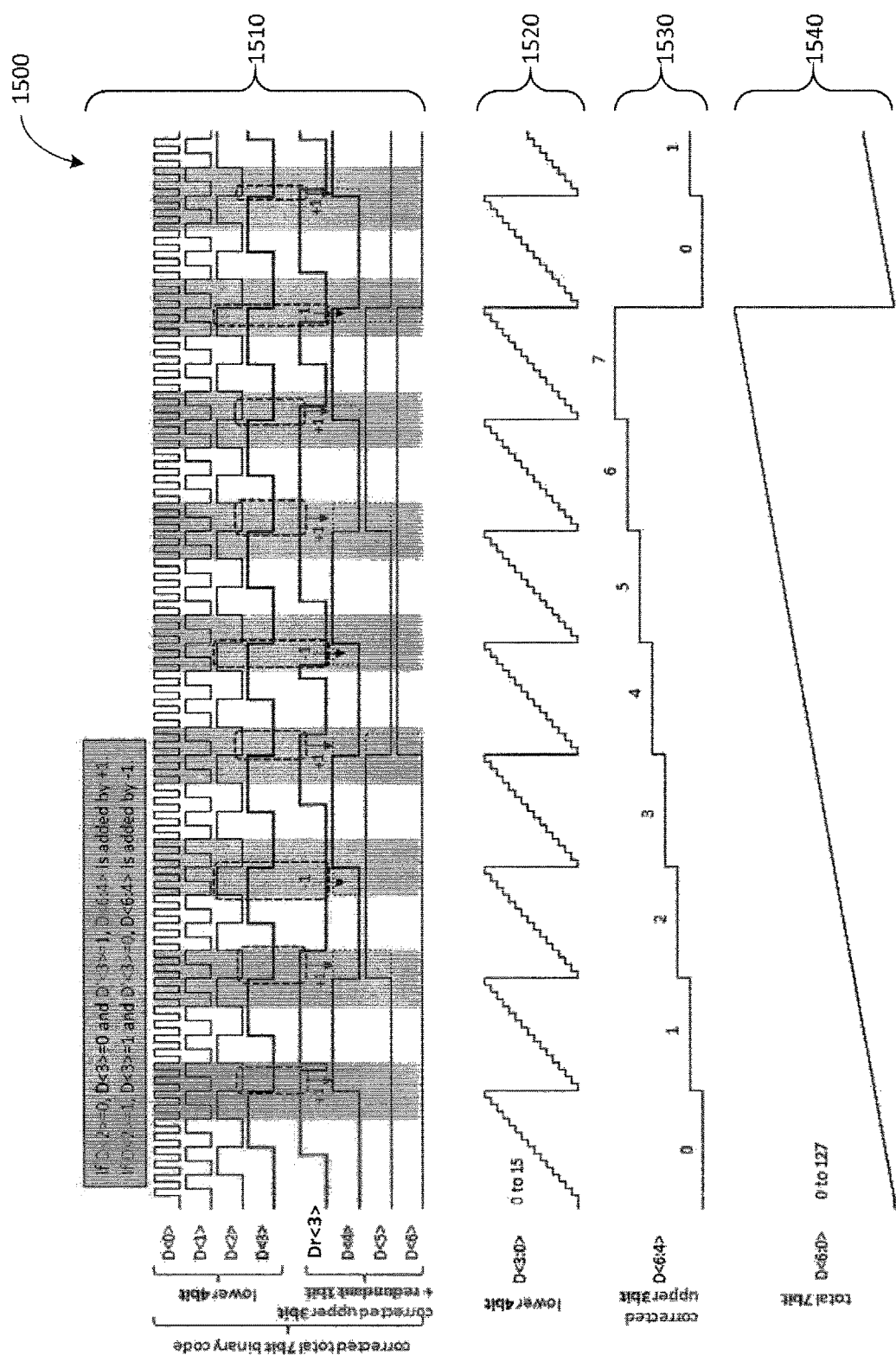
FIG. 15 is timing diagram showing binary code waveforms with errors and corresponding lower bit counts, upper bit counts, and total counts with errors that have been corrected using another example of error correction operations in accordance with the teachings of the present invention.

FIG. 15 is timing diagram 1500 showing binary code waveforms with errors and corresponding lower bit counts, upper bit counts, and total counts with errors that have been corrected using another example of error correction operations in accordance with the teachings of the present invention. In particular, FIG. 15 shows the correct result after errors in FIG. 14 have been corrected using another example of error correction operations in accordance with the teachings of the present invention. When the Gray code of waveforms 1420 is converted to the binary code as shown in waveforms 1510 and 1520 of FIG. 15, the UBC 760 data bits D<6:4> are seen with many errors as indicated by the dashed lines in the shaded regions of waveforms 1510. The erroneous D<6:4> values are corrected using another example of error correction operations in accordance with the teachings of the present invention. In particular: (1) the value of D<6:4> is incremented by 1 when D<2>=0, D<3>=0, and Dr<3>=1; or (2) the value of D<6:4> is decremented by 1 when D<2>=1, D<3>=1, and Dr<3>=0. The final D<6:4> value after the error correction operations are performed is indicated by the solid lines in the shaded regions of waveforms 1510. The corrected D<6:4> values are shown in waveform 1530, and the corrected final 7-bit D<6:0> values are shown in waveform 1540.

It should be appreciated that the two error correction operations disclosed above are just two examples of error correction operations in accordance with the teachings of the present invention. As such, the error correction operations described above are provided for explanation purposes only and should not be viewed as being limited only to the specific two error correction operations described above. In addition, it is appreciated that the effectiveness of the error correction operations is not limited only to the specific N bit counter 700 described in FIG. 7.

Figure 16:
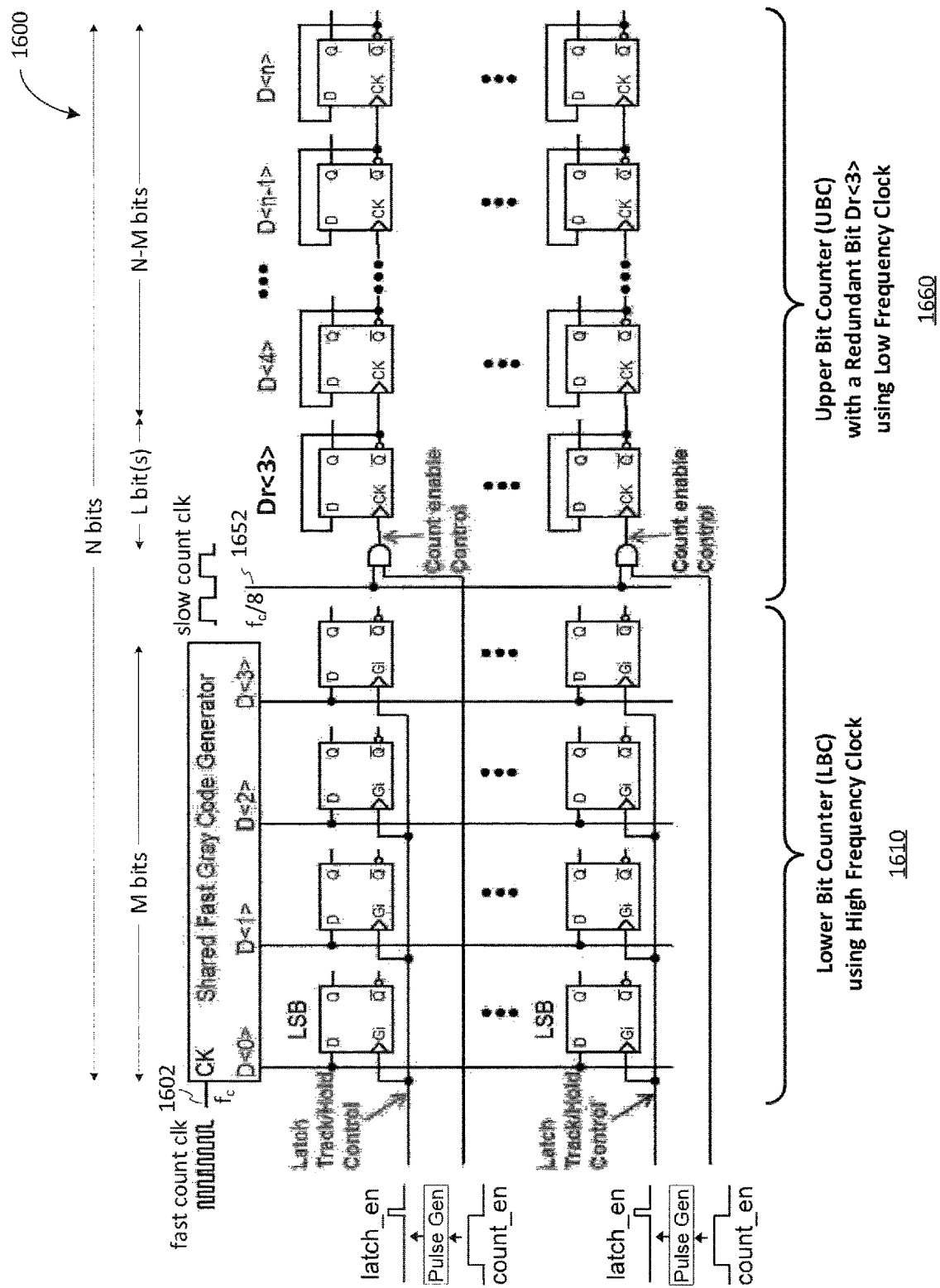
FIG. 16 is an illustration of another example of an N bit multi stage counter with a redundant bit to provide error correction in accordance with the teachings of the present invention.

For instance, FIG. 16 is an illustration of another example of an N bit multi stage counter 1600 with a redundant bit to provide error correction in accordance with the teachings of the present invention. It is noted that N bit multi stage counter 1600 of FIG. 16 shares many similarities with N bit multi stage counter 700 of FIG. 7. For instance, N bit multi stage counter 1600 of FIG. 16 also includes an LBC 1610 that utilizes a shared M bit fast Gray code counter that operates at a first counting frequency under a first clock 1602. However, N bit multi stage counter 1600 includes a UBC 1660 that is implemented using an N−M+L bit binary counter or ripple counter as shown instead of a Gray counter. The counting frequency at the first clock input 1602 of the LBC 1610 is $f_C$ and the number of bits of LBC 1610 is M as shown. In the illustrated example, the second counting frequency at the second clock input 1652 of the UBC 1660 is $f_C/2^{(M-L)}$. Thus, in an example with M=4 and L=1 as shown, the second counting frequency at the second clock input 1652 is equal to $f_C/2^{(4-1)}=f_C/2^{(3)}=f_C/8$. As shown in the depicted example, LBC 1710 is coupled to and is shared by the latch circuitry of multiple columns of an imaging system.

Figure 17:
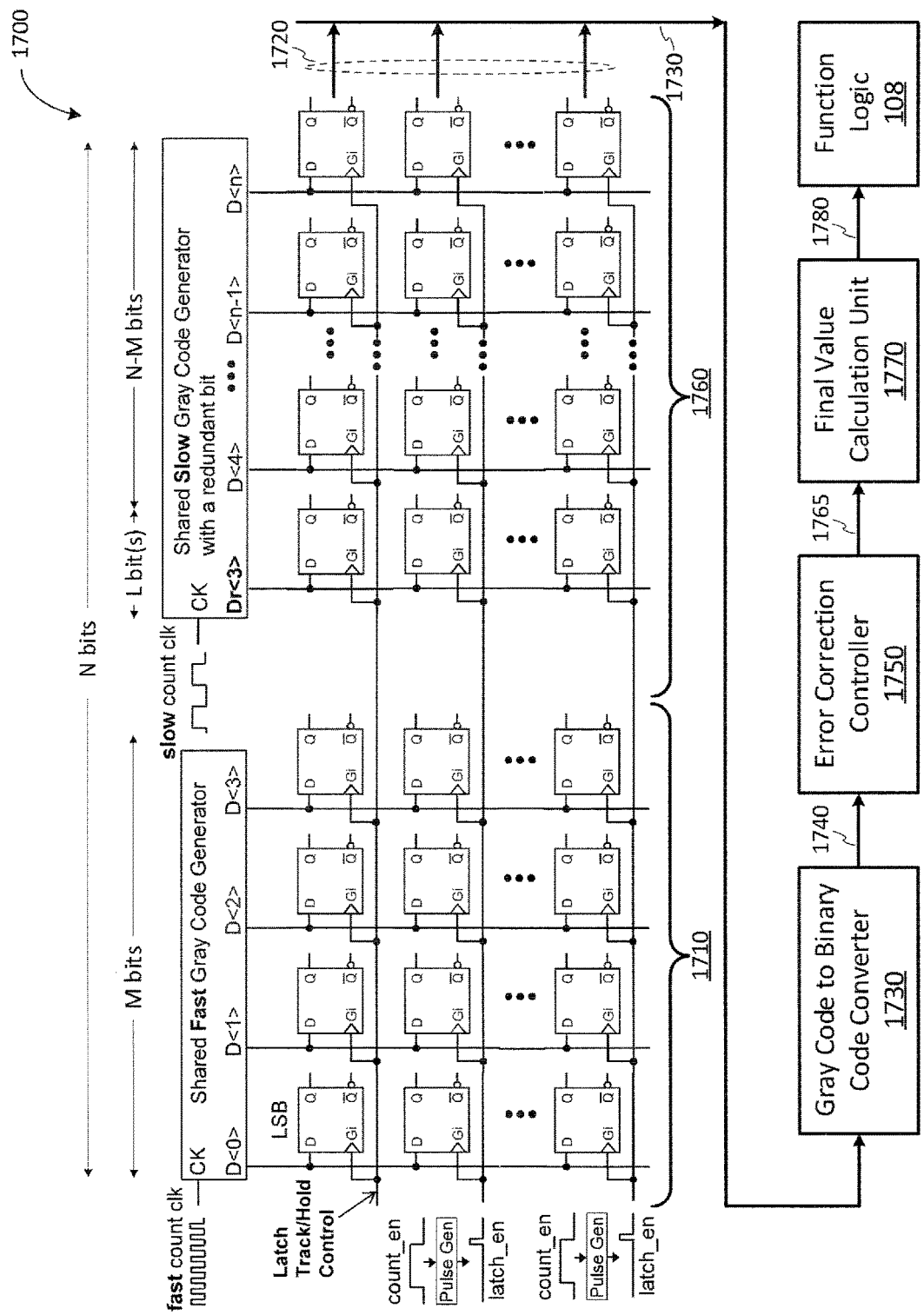
FIG. 17 is an illustration of yet another example of an N bit multi stage counter with a redundant bit including processing blocks that provide error correction operations in accordance with the teachings of the present invention.

FIG. 17 is a diagram of yet another example of an N bit multi stage counter with a redundant bit illustrating one example of processing blocks that provide error correction operations in accordance with the teachings of the present invention. It is noted that N bit multi stage counter 1700 of FIG. 17 shares similarities with N bit multi stage counter 700 of FIG. 7 or N bit multi stage counter 1600 of FIG. 16. As shown, N bit multi stage counter 1700 of FIG. 17 includes an LBC 1710 that utilizes a M bit shared fast Gray code counter that operates at a first counting frequency under a first clock, and a UBC 1760 that utilizes a N−M+L bit shared slow Gray code counter that operates at a second counting frequency under a second clock. In addition, LBC 1710 and UBC 1760 are coupled to and share the latch circuitry of multiple columns of an imaging system. In another example, UBC 1760 may be implemented using an N−M+L bit binary counter or ripple counter as shown in FIG. 16 instead of a Gray counter.

The example depicted in FIG. 17 also illustrates one example of processing blocks that may be utilized to provide error correction operations, some of which may be included in the readout circuitry of an imaging system, as illustrated for example in FIG. 1. As shown in FIG. 17, the Gray code data 1710 is latched in latches in each column after counter operations of from LBC 1710 and UBC 1760 are complete, and is then transferred out of the readout column 1720 and input to the Gray code to binary code converter 1730. As shown, the Gray code to binary converter 1730 is coupled between an error correction controller 1750 and the LBC 1710 and UBC 1760. In operation, the Gray code to binary converter 1750 is coupled to convert any Gray code data that is generated by LBC 1710 and/or UBC 1760 to binary data that is coupled to be received by the error correct controller 1750. Thus, in an example in which UBC 1760 includes a binary counter instead of a Gray code counter, Gray code to binary code converter 1750 does not need to perform a Gray code to binary conversion for the output values of UBC 1760. On the other hand, if UBC 1760 includes a Gray code counter, the Gray code to binary code converter 1750 performs the Gray code to binary conversion for the output values of UBC 1760.

Binary code 1740 is received by the error correction controller 1750 where error correction operations, such as for instance one of the example error correction operations discussed above, are performed to correct errors in the counter values of the UBC 1760 if needed. Counter values 1765 from LBC 1710 and corrected values from UBC 1760 are output to a final value calculation unit 1770 to be combined or concatenated together to form a correct N bit counter value. In operation, calculation unit 1770 is coupled to receive the M bits of LBC 1710 and the corrected N−M MSBs of UBC 1760 from the error correction controller. The calculation unit 1770 is coupled to combine the M bits of LBC 1710 with the corrected N−M MSBs of UBC 1760 to generate an error corrected N bit output of the N bit counter in accordance with the teachings of the present invention. In one example, a subtraction or differencing operation (between a reset ADC data and a signal ADC data) may also take place in calculation unit 1770 to provide out correlated double sampling (CDS) when needed before corrected final digital image data 1780 is fed to the Function Logic 108 of an imaging system.

Figure 18:
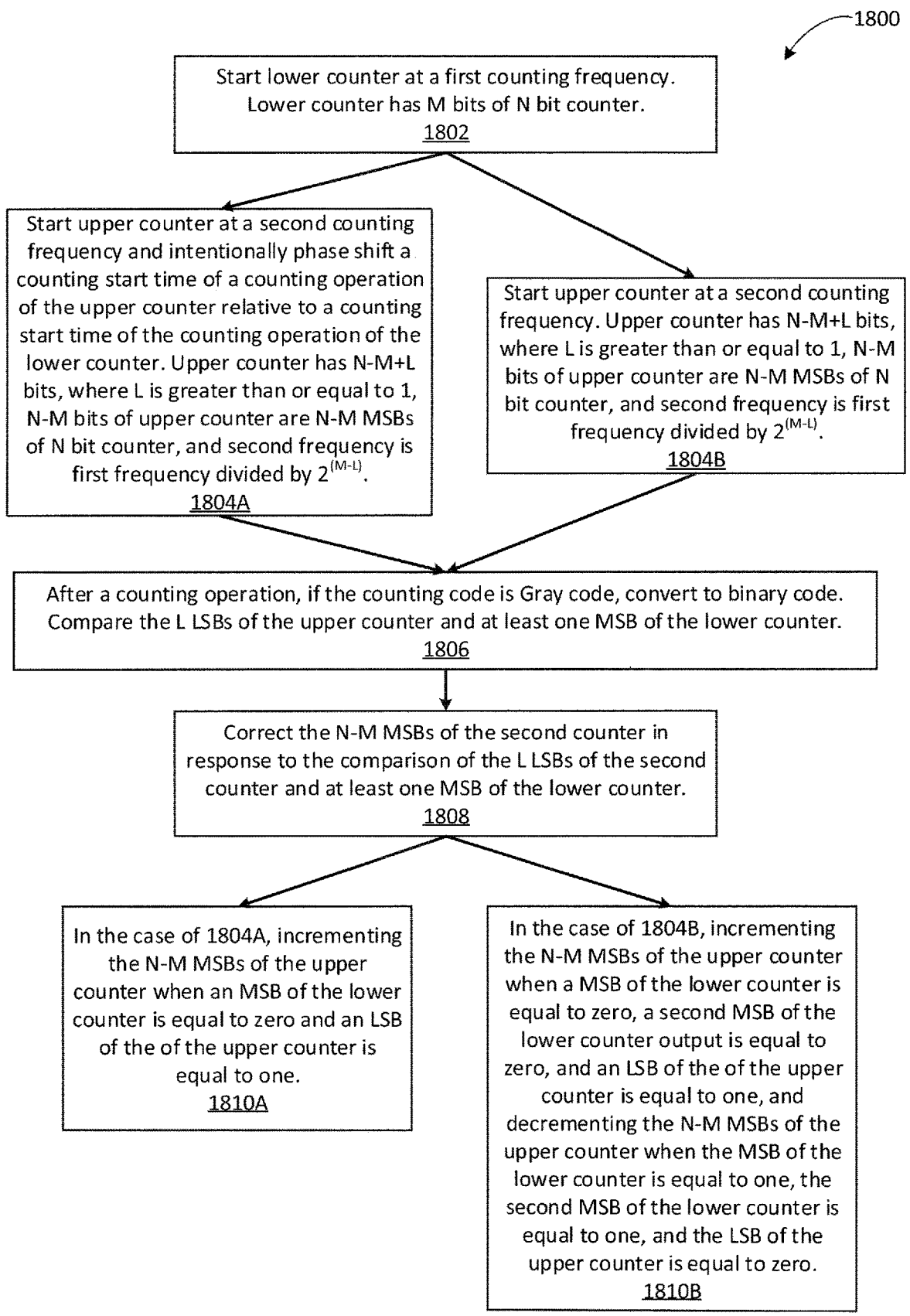
FIG. 18 is a flow diagram illustrating an example process of generating an N bit count with error correction operations in accordance with the teachings of the present invention.

FIG. 18 is a flow diagram 1800 illustrating an example process of generating an N bit count with error correction operations in accordance with the teachings of the present invention. It is appreciated that the processing operations described below may be examples of operations performed with structures described above, some of which may be controlled and performed by error correction controller 1750, and that similarly named elements referenced below are therefore coupled and function similar to those as described above. In addition, it is also noted that the order in which the processing operations are described below are for explanation purposes should not be deemed as limiting. In various examples, it is appreciated that some of the processing operations may be optional, or may occur in a different order, or may occur simultaneously.

As shown in process block 1802, a lower counter is started at a first counting frequency. In one example, the lower counter has a first output having M bits of an N bit counter, where N is greater than M. The M bits of the lower counter are the M LSBs of the N bit counter. In process blocks 1804A and 1804B, an upper counter is started at a second counting frequency. In the example, the upper counter has a second output having N−M+L bits, where L is greater than or equal to one. The second output of the upper counter has N−M most significant bits (MSBs) that are the N−M MSBs of the N bit counter. The second counting frequency is equal to the first counting frequency divided by $2^{(M-L)}$. Additionally, in the example illustrated in process block 1804A, the counting start time of a counting operation of the upper counter is intentionally phase shifted relative to the counting start time of a counting operation of the lower counter.

Process block 1806 shows that after a counting operation of the lower counter and the upper counter is completed, if the counting code is Gray code, the Gray code is converted to binary code, then the L LSBs of the second output of the upper counter and at least one most significant bit (MSB) of the first output of the lower counter are compared. Process block 1808 shows that the N−M MSBs of the second output of the second counter are corrected in response to the comparison of the L LSBs of the second output and the at least one MSB of the first output.

In one example, process block 1810A shows that in the case that process block 1804A was performed, the error correction operation may be performed by incrementing the N−M MSBs of the second output by one when a most significant bit (MSB) of the first output is equal to zero and a least significant bit (LSB) of the of the second output of the second counter is equal to one.

In another example, process block 1810B shows that in the case that process block 1804B was performed, the error correction operation may be performed by incrementing the N−M MSBs of the second output of the upper counter by one when a most significant bit (MSB) of the first output of the lower counter is equal to zero, a second MSB of the first output of the lower counter is equal to zero, and a least significant bit (LSB) of the of the second output of the upper counter is equal to one, and by decrementing the N−M MSBs of the second output upper counter by one when the MSB of the first output of the lower counter is equal to one, the second MSB of the first output of the lower counter is equal to one, and the LSB of the of the second output of the upper counter is equal to zero.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An N bit counter having lower bits and upper bits, the N bit counter comprising:
   a lower counter having a first output, wherein the first output has M bits, wherein N is greater than M, wherein the lower counter operates at a first counting frequency;
   an upper counter having a second output, wherein the second output has N−M+L bits, wherein L is greater than or equal to one, wherein the second output has N−M most significant bits (MSBs) and L least significant bits (LSBs), wherein the upper counter operates at a second counting frequency, wherein the second counting frequency is equal to the first counting frequency divided by $2^{(M-L)}$; and
   an error correction controller coupled to receive the first output and the second output after a counting operation of the lower counter and the upper counter, wherein the error correction controller includes logic that when executed causes the error controller to perform operations, including:
      comparing the L LSBs of the second output and at least one most significant bit (MSB) of the first output; and
      correcting the N−M MSBs of the second output in response to the comparison of the L LSBs of the second output and the at least one MSB of the first output, wherein the lower bits of the N bit counter are the M bits of the first output, and wherein the upper bits of the N bit counter are the corrected N−M MSBs of the second output.

2. The N bit counter of claim 1, wherein L is equal to one.

3. The N bit counter of claim 1, wherein a counting start time of the counting operation of the upper counter is phase shifted relative to a counting start time of the counting operation of the lower counter.

4. The N bit counter of claim 1, wherein the operation of correcting the N−M MSBs of the second output in response to the comparison of the L LSBs of the second output and the at least one MSB of the first output comprises:
   incrementing the N−M MSBs of the second output by one when a most significant bit (MSB) of the first output is equal to zero and a least significant bit (LSB) of the of the second output of the second counter is equal to one.

5. The N bit counter of claim 1, wherein the operation of correcting the N−M MSBs of the second output in response to the comparison of the L LSBs of the second output and the at least one MSB of the first output comprises:
   incrementing the N−M MSBs of the second output by one when a most significant bit (MSB) of the first output is equal to zero, a second MSB of the first output is equal to zero, and a least significant bit (LSB) of the of the second output of the second counter is equal to one.

6. The N bit counter of claim 5, wherein the operation of correcting the N−M MSBs of the second output in response to the comparison of the L LSBs of the second output and the at least one MSB of the first output further comprises:
   decrementing the N−M MSBs of the second output by one when the MSB of the first output is equal to one, the second MSB of the first output is equal to one, and the LSB of the of the second output of the second counter is equal to zero.

7. The N bit counter of claim 1, further comprising:
   a Gray code to binary code converter coupled between the error correction controller and the lower and upper counters, wherein the Gray code to binary code converter is coupled to convert any Gray code data generated by the lower and upper counters to binary data coupled to be received by the error correct controller.

8. The N bit counter of claim 7, wherein the lower counter comprises a Gray code counter and wherein the upper counter comprises a Gray code counter.

9. The N bit counter of claim 7, wherein the lower counter comprises a Gray code counter and wherein the upper counter comprises a binary counter.

10. The N bit counter of claim 1, further comprising:
    latch circuitry coupled to latch the first output and the second output of the lower counter and the upper counter to acquire a counting code, wherein the error correction controller is coupled to the latch circuitry to receive the latched first output and the latched second output.

11. The N bit counter of claim 1, further comprising:
    a calculation unit coupled to receive the M bits of the first output and the corrected N−M MSBs of the second output from the error correction controller, wherein the calculation unit is coupled to combine the M bits of the first output and the corrected N−M MSBs of the second output to generate an error corrected N bit output of the N bit counter.

12. The N bit counter of claim 11, wherein the calculation unit is further coupled to subtract a previous reset output value of N bit counter from the error corrected N bit output of the N bit counter to provide an error corrected correlated double sampling (CDS) output value.

13. An imaging system, comprising:
    a pixel array including a plurality of pixels organized into a plurality of rows and columns;
    control circuitry coupled to the pixel array to control operation of the pixel array; and
    a readout circuit coupled to the pixel array to readout the image data from the pixels, wherein the readout circuit includes analog to digital converter (ADC) circuitry coupled to convert the image data from the pixels to digital image data, wherein the ADC circuitry includes ramp circuitry and at least one comparator coupled to at least one N bit counter, wherein the N bit counter comprises:

a lower counter having a first output, wherein the first output has M bits, wherein N is greater than M, wherein the lower counter operates at a first counting frequency;

an upper counter having a second output, wherein the second output has N−M+L bits, wherein L is greater than or equal to one, wherein the second output has N−M most significant bits (MSBs) and L least significant bits (LSBs), wherein the upper counter operates at a second counting frequency, wherein the second counting frequency is equal to the first counting frequency divided by $2^{(M-L)}$; and an error correction controller coupled to receive the first output and the second output after a counting operation of the lower counter and the upper counter, wherein the error correction controller includes logic that when executed causes the error controller to perform operations, including:

comparing the L LSBs of the second output and at least one most significant bit (MSB) of the first output; and correcting the N−M MSBs of the second output in response to the comparison of the L LSBs of the second output and the at least one MSB of the first output, wherein the lower bits of the N bit counter are the M bits of the first output, and wherein the upper bits of the N bit counter are the corrected N−M MSBs of the second output.

14. The imaging system of claim 13, further comprising: function logic coupled to the readout circuit to store the digital image data received from the readout circuit.

15. The imaging system of claim 13, wherein L is equal to one.

16. The imaging system of claim 13, wherein a counting start time of the counting operation of the upper counter is phase shifted relative to a counting start time of the counting operation of the lower counter.

17. The imaging system of claim 13, wherein the operation of correcting the N−M MSBs of the second output in response to the comparison of the L LSBs of the second output and the at least one MSB of the first output comprises:

incrementing the N−M MSBs of the second output by one if a most significant bit (MSB) of the first output is equal to zero and a least significant bit (LSB) of the of the second output of the second counter is equal to one.

18. The imaging system of claim 13, wherein the operation of correcting the N−M MSBs of the second output in response to the comparison of the L LSBs of the second output and the at least one MSB of the first output comprises:

incrementing the N−M MSBs of the second output by one if a most significant bit (MSB) of the first output is equal to zero, a second MSB of the first output is equal to zero, and a least significant bit (LSB) of the of the second output of the second counter is equal to one.

19. The imaging system of claim 18, wherein the operation of correcting the N−M MSBs of the second output in response to the comparison of the L LSBs of the second output and the at least one MSB of the first output further comprises:

decrementing the N−M MSBs of the second output by one if the MSB of the first output is equal to one, the second MSB of the first output is equal to one, and the LSB of the of the second output of the second counter is equal to zero.

20. The imaging system of claim 13, wherein the N bit counter further comprises:

a Gray code to binary code converter coupled between the error correction controller and the lower and upper counters, wherein the Gray code to binary code converter is coupled to convert any Gray code data generated by the lower and upper counters to binary data coupled to be received by the error correct controller.

21. The imaging system of claim 20, wherein the lower counter comprises a Gray code counter and wherein the upper counter comprises a Gray code counter.

22. The imaging system of claim 20, wherein the lower counter comprises a Gray code counter and wherein the upper counter comprises a binary counter.

23. The imaging system of claim 13, wherein the N bit counter further comprises:

latch circuitry coupled to latch the first output and the second output of the lower counter and the upper counter to acquire a counting code, wherein the error correction controller is coupled to the latch circuitry to receive the latched first output and the latched second output.

24. The imaging system of claim 13, wherein the N bit counter further comprises:

a calculation unit coupled to receive the M bits of the first output and the corrected N−M MSBs of the second output from the error correction controller, wherein the calculation unit is coupled to combine the M bits of the first output and the corrected N−M MSBs of the second output to generate an error corrected N bit output of the N bit counter.

25. The imaging system of claim 24, wherein the calculation unit is further coupled to subtract a previous reset output value of the N bit counter from the error corrected N bit output of the N bit counter to provide an error corrected correlated double sampling (CDS) output value.

26. A method of generating an error corrected output of an N bit counter, comprising:

starting a lower counter at a first counting frequency, wherein the lower counter has a first output having M bits, wherein N is greater than M;

starting an upper counter at a second counting frequency, wherein the upper counter has a second output having N−M+L bits, wherein L is greater than or equal to one, wherein the second output has N−M most significant bits (MSBs) and L least significant bits (LSBs), wherein the second counting frequency is equal to the first counting frequency divided by $2^{(M-L)}$;

comparing the L LSBs of the second output and at least one most significant bit (MSB) of the first output after a counting operation of the lower counter and the upper counter; and correcting the N−M MSBs of the second output in response to the comparison of the L LSBs of the second output and the at least one MSB of the first output, wherein the lower bits of the N bit counter are the M bits of the first output, and wherein the upper bits of the N bit counter are the corrected N−M MSBs of the second output.

27. The method of claim 26, wherein L is equal to one.

28. The method of claim 26, further comprising:

phase shifting a counting start time of the counting operation of the upper counter relative to a counting start time of the counting operation of the lower counter.

29. The method of claim 26, wherein said correcting the N−M MSBs of the second output in response to the comparison of the L LSBs of the second output and the at least one MSB of the first output comprises:

incrementing the N−M MSBs of the second output by one when a most significant bit (MSB) of the first output is equal to zero and a least significant bit (LSB) of the of the second output of the second counter is equal to one.

30. The method of claim 26, wherein said correcting the N−M MSBs of the second output in response to the comparison of the L LSBs of the second output and the at least one MSB of the first output comprises:

incrementing the N−M MSBs of the second output by one when a most significant bit (MSB) of the first output is equal to zero, a second MSB of the first output is equal to zero, and a least significant bit (LSB) of the of the second output of the second counter is equal to one.

31. The method of claim 30, wherein said correcting the N−M MSBs of the second output in response to the comparison of the L LSBs of the second output and the at least one MSB of the first output further comprises:

decrementing the N−M MSBs of the second output by one when the MSB of the first output is equal to one, the second MSB of the first output is equal to one, and the LSB of the of the second output of the second counter is equal to zero.

32. The method of claim 26, further comprising:

converting any Gray code data generated by the lower and upper counters to binary data.

33. The method of claim 32, wherein the lower counter comprises a Gray code counter and wherein the upper counter comprises a Gray code counter.

34. The method of claim 32, wherein the lower counter comprises a Gray code counter and wherein the upper counter comprises a binary counter.

35. The method of claim 26, further comprising:

latching the first output and the second output of the lower counter and the upper counter to acquire a counting code.

36. The method of claim 26, further comprising:

combining the M bits of the first output and the corrected N−M MSBs of the second output to generate the error corrected N bit output.

\* \* \* \* \*